United States Patent
Fukuoka et al.

(10) Patent No.: US 10,340,140 B2
(45) Date of Patent: Jul. 2, 2019

(54) SUBSTRATE PROCESSING APPARATUS AND SUBSTRATE PROCESSING METHOD

(71) Applicant: Tokyo Electron Limited, Tokyo (JP)

(72) Inventors: Tetsuo Fukuoka, Koshi (JP); Masashi Itonaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/848,228

(22) Filed: Dec. 20, 2017

(65) Prior Publication Data

US 2018/0182612 A1 Jun. 28, 2018

(30) Foreign Application Priority Data

Dec. 22, 2016 (JP) .................. 2016-249480

(51) Int. Cl.
*H01L 21/027* (2006.01)
*H01L 21/66* (2006.01)
*H01L 21/67* (2006.01)

(52) U.S. Cl.
CPC ...... *H01L 21/027* (2013.01); *H01L 21/67017* (2013.01); *H01L 21/67253* (2013.01); *H01L 21/67288* (2013.01); *H01L 22/10* (2013.01); *H01L 21/0273* (2013.01)

(58) Field of Classification Search
CPC ............. H01L 21/027; H01L 21/67288; H01L 21/67253; H01L 21/67017; H01L 22/10; H01L 21/0273
See application file for complete search history.

(56) References Cited

U.S. PATENT DOCUMENTS

| | | | | |
|---|---|---|---|---|
| 5,963,336 A | * | 10/1999 | McAndrew | C23C 16/4412 216/60 |
| 6,442,736 B1 | * | 8/2002 | Girard | C23C 8/16 438/16 |
| 6,499,492 B1 | * | 12/2002 | Cho | H01J 37/32935 134/1.1 |

(Continued)

FOREIGN PATENT DOCUMENTS

JP 2013-004804 A 1/2013

OTHER PUBLICATIONS

Joe Daggett, Dr. Samuel Villareal, HMDS Process Setup#SP2003-LI-001 Copyright (c) 2003, The University of Texas at Dallas, pp. 1-7 (Year: 2003).*

*Primary Examiner* — William Coleman
(74) *Attorney, Agent, or Firm* — Pearne & Gordon LLP

(57) ABSTRACT

An abnormal processing can be appropriately detected in a processing of supplying a preset gas to a substrate as a processing target. A hydrophobizing unit U5 includes a processing vessel 21 configured to accommodate therein a wafer W as a processing target; an opening/closing unit 60 (first supply unit) configured to supply air (first gas) into the processing vessel 21; a gas supply unit 30 (second supply unit) configured to supply a HMDS gas (second gas), having a relative humidity different from that of the air, into the processing vessel 21; and a controller 100 (control unit). The controller 100 is configured to determine a state of a gas within the processing vessel 21 based on a relative humidity obtained after a supply of the air by the opening/closing unit 60 and a supply of the HMDS gas by the gas supply unit 30 are performed.

13 Claims, 14 Drawing Sheets

(56) References Cited

U.S. PATENT DOCUMENTS

| | | | | |
|---|---|---|---|---|
| 6,617,095 B2 * | 9/2003 | Kitano | ............... | G03F 7/16 |
| | | | | 118/712 |
| 6,689,521 B1 * | 2/2004 | Goodwin | ............... | B08B 7/00 |
| | | | | 134/1.2 |
| 7,129,187 B2 * | 10/2006 | Joe | ............... | C23C 16/30 |
| | | | | 438/769 |
| 7,195,872 B2 * | 3/2007 | Agrawal | ............... | B01J 19/0046 |
| | | | | 422/503 |
| 9,548,200 B2 * | 1/2017 | Wong | ............... | H01L 21/02345 |
| 9,625,341 B2 * | 4/2017 | Haick | ............... | B82Y 15/00 |
| 2004/0221871 A1 * | 11/2004 | Fletcher | ............... | H01L 21/67184 |
| | | | | 134/6 |
| 2012/0177846 A1 * | 7/2012 | Li | ............... | C23C 16/045 |
| | | | | 427/579 |

\* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2016-249480 filed on Dec. 22, 2016, the entire disclosures of which are incorporated herein by reference.

TECHNICAL FIELD

The embodiments described herein pertain generally to a substrate processing apparatus and a substrate processing method.

BACKGROUND

A substrate processing apparatus configured to hydrophobize a substrate by supplying a HMDS (hexamethyldisilazane) gas onto a surface of the substrate placed in a processing vessel is described in Patent Document 1.

Patent Document 1: Japanese Patent Laid-open Publication No. 2013-004804

In a processing in which a preset gas is supplied to a substrate as a processing target, like the aforementioned hydrophobic processing, it may be difficult to detect a state of the gas within an apparatus.

SUMMARY

In view of the foregoing, exemplary embodiments provide a technique of appropriately detecting a state of a gas within an apparatus in a processing of supplying a preset gas to the substrate as a processing target.

In one exemplary embodiment, there is provided a substrate processing apparatus including a processing vessel configured to accommodate therein a substrate as a processing target; a first supply unit configured to supply a first gas into the processing vessel; a second supply unit configured to supply a second gas, having a relative humidity different from that of the first gas, into the processing vessel; and a control unit. The control unit is configured to determine a state of a gas within the processing vessel based on a relative humidity obtained after a supply of the first gas by the first supply unit and a supply of the second gas by the second supply unit are performed.

In the substrate processing apparatus, the first gas and the second gas having different relative humidities are supplied into the processing vessel, and the state of the gas such as the abnormality of the processing is determined based on the relative humidity obtained after the supplies of these gases. In case that the gases having the different relative humidities are supplied, the relative humidity obtained after the supplies of these gases is determined based on a supply ratio of these gases. For this reason, by considering the relative humidity obtained after the supplies of the gases, the increase or the decrease of the supply amount of one gas for any reason can be detected, for example. In this way, the change of the state of the gas (abnormality of the processing) in the processing vessel can be appropriately detected. As stated above, in the substrate processing apparatus, it is possible to detect the state of the gas appropriately in the processing of supplying the preset gas to the substrate as the processing target.

The substrate processing apparatus may further include a humidity measuring unit configured to measure the relative humidity within the substrate processing apparatus. The control unit may be configured to acquire the relative humidity measured by the humidity measuring unit, and determine abnormality of a processing in the processing vessel based on the acquired relative humidity. Accordingly, the relative humidity within the substrate processing apparatus can be securely and easily acquired, and an abnormal processing can be more appropriately detected.

The control unit may determine the abnormality of the processing in the processing vessel by comparing the relative humidity measured by the humidity measuring unit with a reference data which is a relative humidity obtained when the processing in the processing vessel is performed normally. By using this reference data, the abnormal processing can be detected easily with high precision.

The substrate processing apparatus may further include a gas exhaust line configured to exhaust the gas within the processing vessel, and the humidity measuring unit may be provided at the gas exhaust line. As a relative humidity in the gas exhaust line is measured, a relative humidity of a gas including both the first gas and the second gas (that is, a gas in which the first gas and the second gas are joined) supplied into the processing vessel can be appropriately acquired. Accordingly, the abnormal processing can be more appropriately detected.

The substrate processing apparatus may further include a temperature measuring unit configured to measure a temperature within the processing vessel. The control unit may convert a value of the relative humidity measured by the humidity measuring unit in consideration of the temperature measured by the temperature measuring unit, and determine the abnormality of the processing in the processing vessel based on the converted relative humidity. Since the relative humidity is changed depending on a temperature environment, by converting the value of the relative humidity in consideration of the temperature, the abnormal processing can be more appropriately detected.

The humidity measuring unit may be a capacitive humidity sensor. Accordingly, the relative humidity can be more appropriately measured.

The first supply unit may supply air as the first gas, and the second supply unit may supply as the second gas a processing gas for hydrophobization of a surface of the substrate. The processing gas for the hydrophobization is coated on the substrate. Since, however, a very thin film is formed, there is no way to investigate, if any, an error immediately after the coating is performed. Thus, it is typically difficult to detect the error until it becomes a defect after a developing processing. Meanwhile, by acquiring the relative humidity obtained after the supply of the air and the supply of the processing gas, it is possible to appropriately detect an excessive supply of the air or the like in the hydrophobic processing. That is, in the substrate processing apparatus according to the exemplary embodiment, the abnormal processing in the hydrophobic processing of the surface of the substrate can be appropriately detected.

The control unit may be configured to control the first supply unit to supply the air into the processing vessel by opening the processing vessel, and control the second supply unit to supply the processing gas after the supply of the air by the first supply unit is ended. Accordingly, the supply of the air and the supply of the processing gas can be appropriately performed in the hydrophobic processing, and the relative humidity can be appropriately detected, so that the abnormal processing can be appropriately detected.

The control unit may acquire a processing gas supply humidity which is the relative humidity measured by the humidity measuring unit after the supply of the processing gas by the second supply unit, and determine the abnormality of the processing in the processing vessel based on the processing gas supply humidity. Since the processing gas has a relatively humidity lower than that of the air, the processing gas supply humidity becomes lower than a humidity before the supply of the processing gas when the processing is performed normally. Therefore, if the processing gas supply humidity is not lower than the humidity before the supply of the processing gas, for example, it may be determined that the processing is abnormal.

The substrate processing apparatus may further include a purge gas supply unit configured to supply a purge gas having a relative humidity lower than those of the air and the processing gas in order to purge the processing gas after the supply of the processing gas by the second supply unit. The control unit may be configured to control the purge gas supply unit to supply the purge gas after the supply of the processing gas by the second supply unit is ended. Accordingly, the processing gas after the hydrophobic processing can be appropriately purged, so that a next hydrophobic processing can be appropriately performed.

The control unit may acquire a purge gas supply humidity which is the relative humidity measured by the humidity measuring unit after the supply of the purge gas by the purge gas supply unit, and determine the abnormality of the processing in the processing vessel based on the purge gas supply humidity. The purge gas has a relative humidity very much lower than those of the air and the processing gas. Thus, when the processing is performed normally, the purge gas supply humidity becomes remarkably lower (e.g., 0%) than a humidity before the supply of the purge gas. Therefore, if the purge gas supply humidity is not 0%, for example, it may be determined that the processing is abnormal.

The control unit may determine a concentration of the gas within the processing vessel based on the relative humidity obtained after the supply of the first gas by the first supply unit and the supply of the second gas by the second supply unit are performed. Since the relative humidity of the gas is substantially proportionate to the concentration of the gas, by considering the relative humidity, it may be possible to determine the concentration of the gas with high accuracy without providing another configuration for measuring the concentration of the gas.

A substrate processing method performed by a substrate processing apparatus includes supplying a first gas into a processing vessel configured to accommodate therein a substrate as a processing target; supplying a second gas, having a relative humidity different from that of the first gas, into the processing vessel; and determining abnormality of a processing in the processing vessel based on a relative humidity obtained after the supplying of the first gas by the first supply unit and the supplying of the second gas by the second supply unit are performed.

According to the exemplary embodiments, the state of the gas within the apparatus can be appropriately detected in the processing of supplying the preset gas to the substrate as the processing target.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
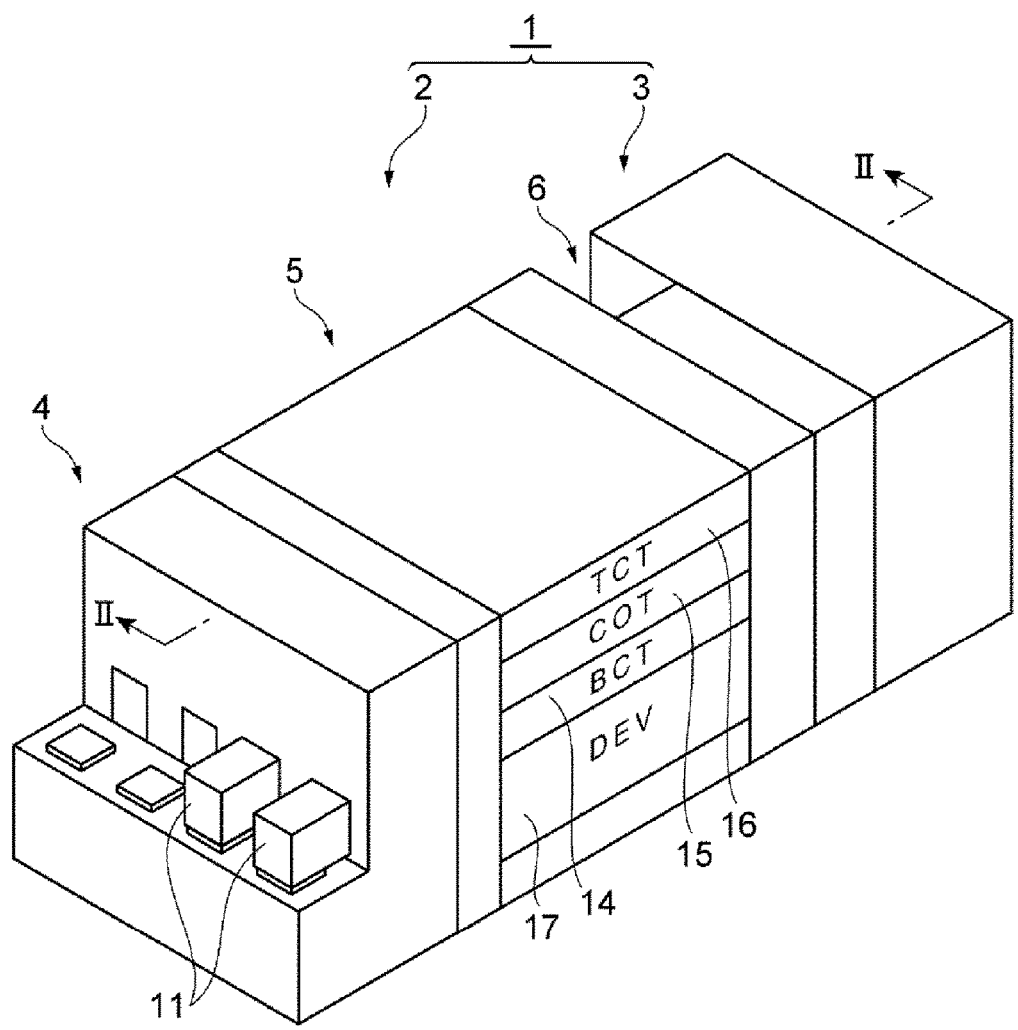
FIG. 1 is a perspective view illustrating a schematic configuration of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein Hereinafter, various exemplary embodiments will be described in detail with reference to the accompanying drawings. In the description, same parts or parts having same functions will be assigned same reference numerals, and redundant description will be omitted.

[Substrate Processing System]

A substrate processing system 1 is a system configured to perform formation of a photosensitive film on a substrate, exposure of the corresponding photosensitive film and development of the corresponding photosensitive film. The substrate as a processing target is, for example, a semiconductor wafer W. The photosensitive film is, by way of non-limiting example, a resist film. The substrate processing system 1 includes a coating and developing apparatus 2 and an exposure apparatus 3. The exposure apparatus 3 is configured to perform an exposure processing of the resist film (photosensitive film) formed on the wafer W (substrate). To elaborate, the exposure apparatus 3 irradiates an energy beam to an exposure target portion of the resist film by an immersion exposure method or the like. The coating and developing apparatus 2 is configured to perform a processing of forming the resist film on a surface of the wafer W (substrate) prior to the exposure processing by the exposure apparatus 3 and perform a developing processing of the resist film after the exposure processing.

[Substrate Processing Apparatus]

Figure 2:
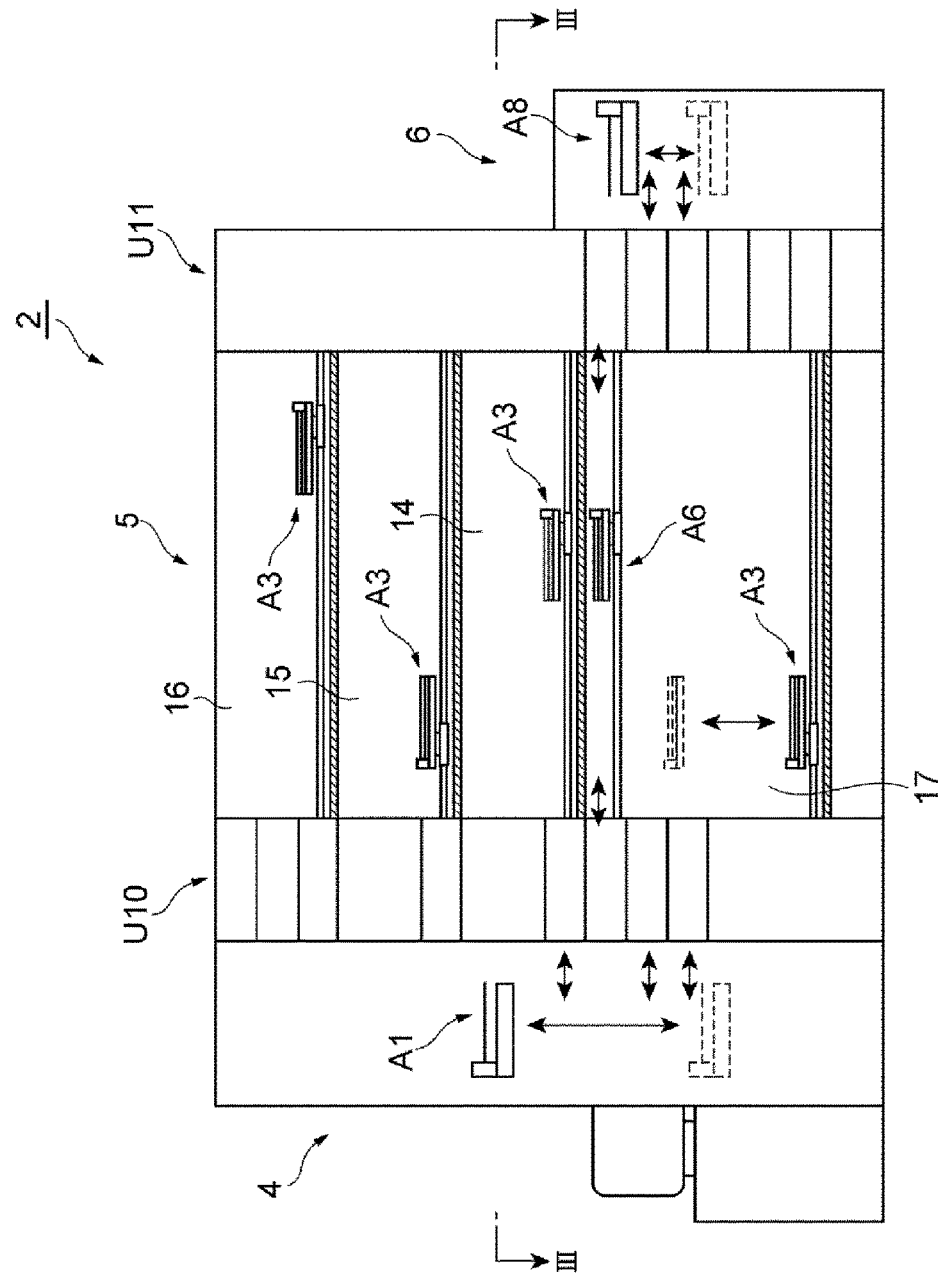
FIG. 2 is a cross sectional view taken along a line II-II of FIG. 1.
Figure 3:
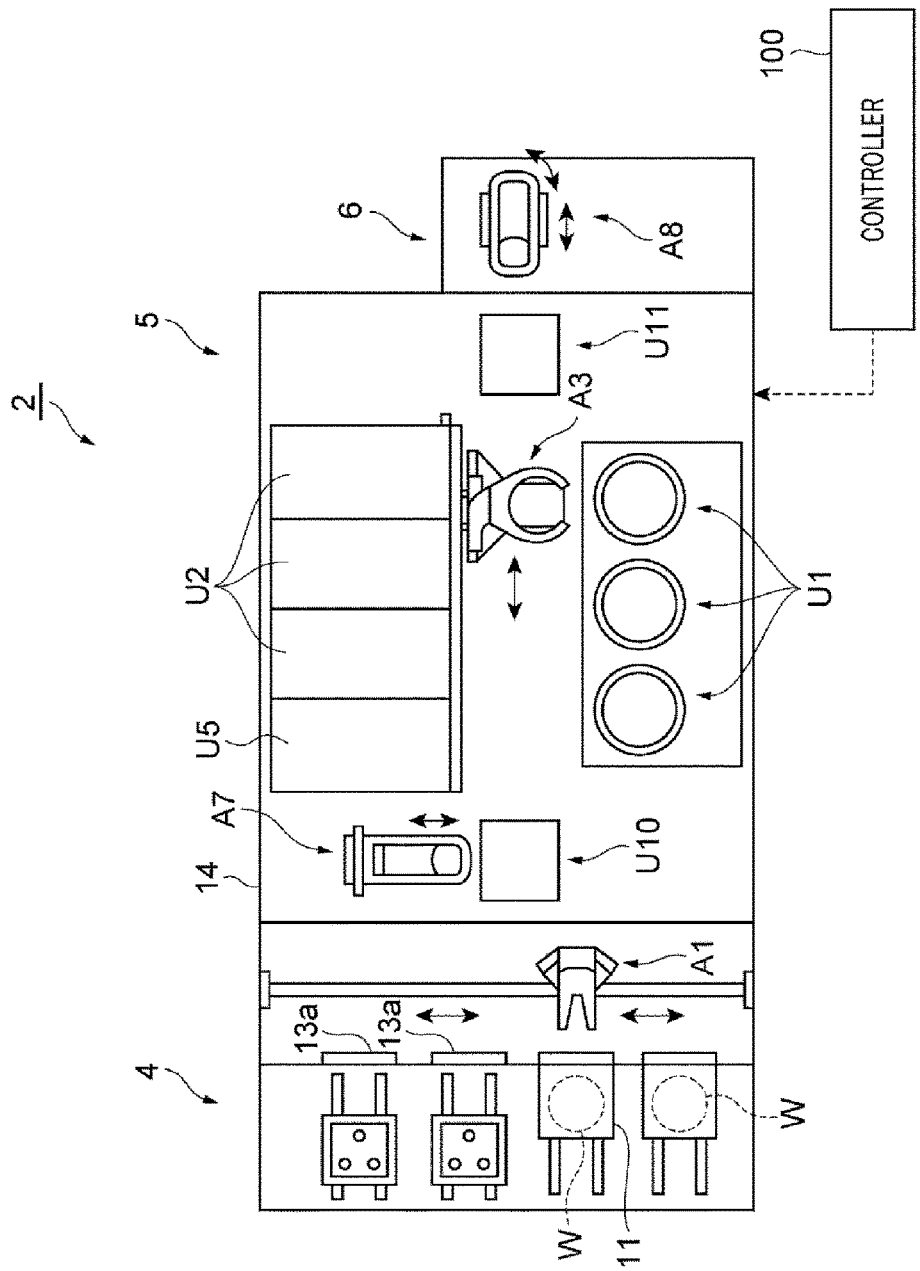
FIG. 3 is a cross sectional view taken along a line III-Ill of FIG. 2.

Hereinafter, a configuration of the coating and developing apparatus 2 as an example of a substrate processing apparatus will be explained. As depicted in FIG. 1 to FIG. 3, the coating and developing apparatus 2 is equipped with a carrier block 4, a processing block 5, an interface block 6 and a controller 100 (control unit).

The carrier block 4 is configured to carry a wafer W into/from the coating and developing apparatus 2. For example, the carrier block 4 is configured to support a multiple number of carriers 11 for wafers W and incorporates therein a delivery arm A1. Each carrier 11 is configured to accommodate therein, for example, a plurality of circular wafers W. The delivery arm A1 is configured to take out a wafer W from the carrier 11, deliver the wafer W to the processing block 5, receive the wafer W from the processing block 5 and return the wafer W back into the carrier 11.

The processing block 5 includes multiple processing modules 14, 15, 16 and 17. As shown in FIG. 2 and FIG. 3, each of the processing modules 14, 15, 16 and 17 incorporates multiple liquid processing units U1, multiple heat treatment units U2 and a transfer arm A3 configured to transfer the wafer W into these units. The processing module 17 further includes a direct transfer arm A6 configured to directly transfer a wafer W without accessing the liquid processing units U1 and the heat treatment units U2. Each liquid processing unit U1 is configured to supply a processing liquid to a surface of a wafer W. Each heat treatment unit U2 incorporates therein, for example, a heating plate and a cooling plate, and is configured to perform a heat treatment by heating the wafer W with the heating plate and cooling the heated wafer W with the cooling plate.

The processing module 14 is configured to form a bottom film (e.g., an antireflection film) on the surface of the wafer W by the liquid processing unit U1 and the heat treatment unit U2. The liquid processing unit U1 of the processing module 14 is configured to coat a processing liquid for forming the bottom film on the wafer W. The heat treatment unit U2 of the processing module 14 is configured to perform various kinds of heat treatments required to form the bottom film. An example of the heat treatment performed in the heat treatment unit U2 of the processing module 14 may be a heating processing for hardening the bottom film. The processing module 14 further includes a hydrophobizing unit U5. The hydrophobizing unit U5 is configured to perform a hydrophobic processing on the surface of the wafer W on which the bottom film is formed. Details of the hydrophobizing unit U5 will be explained later.

The processing module 15 is configured to form a resist film on the bottom film by the liquid processing unit U1 and the heat treatment unit U2. The liquid processing unit U1 of the processing module 15 is configured to coat a processing liquid for forming the resist film on the bottom film. The heat treatment unit U2 of the processing module 15 is configured to perform various kinds of heat treatments required to form the resist film.

The processing module 16 is configured to form a top film on the resist film by the liquid processing unit U1 and the heat treatment unit U2. The liquid processing unit U1 of the processing module 16 is configured to coat a liquid for forming the top film on the resist film. The heat treatment unit U2 of the processing module 16 is configured to perform various kinds of heat treatments required to form the top film.

The processing module 17 is configured to perform a developing processing of the exposed resist film, on which the exposure processing is already performed, by the liquid processing unit U1 and the heat treatment unit U2. The liquid processing unit U1 of the processing module 17 is configured to perform the developing processing of the resist film by coating a developing liquid on the surface of the exposed wafer W and washing it with a rinse liquid. The heat treatment unit U2 of the processing module 17 is configured to perform various kinds of heat treatments required for the developing processing. Specific examples of these heat treatments include a heat treatment (PEB: Post Exposure Bake) performed before the developing processing, a heat treatment (PB: Post Bake) performed after the developing processing, and so forth.

Within the processing block 5, a shelf unit U10 is provided at a side of the carrier block 4. The shelf unit U10 is partitioned into a multiple number of cells arranged in a vertical direction. An elevation arm A7 is provided in the vicinity of the shelf unit U10. The elevation arm A7 is configured to move up and down the wafer W among the cells of the shelf unit U10.

Within the processing block 5, a shelf unit U11 is provided at a side of the interface block 6. The shelf unit U11 is partitioned into multiple cells which are arranged in the vertical direction.

The interface block 6 is configured to deliver the wafer W into/from the exposure apparatus 3. By way of example, the interface block 6 incorporates a delivery arm A8 and is connected to the exposure apparatus 3. The delivery arm A8 is configured to deliver the wafer W placed in the shelf unit U11 to the exposure apparatus 3, and receives the wafer W from the exposure apparatus 3 to return the received wafer W back into the shelf unit U11.

The controller 100 controls the coating and developing apparatus 2 to perform a coating and developing processing according to the following sequence, for example. First, the controller 100 controls the delivery arm A1 to transfer the wafer W within the carrier 11 to the shelf unit U10, and controls the elevation arm A7 to place this wafer W in the cell for the processing module 14.

Then, the controller 100 controls the transfer arm A3 to transfer the wafer W placed in the shelf unit U10 into the liquid processing unit U1 and the heat treatment unit U2 within the processing module 14, and controls the liquid processing unit U1, the heat treatment unit U2 and the hydrophobizing unit U5 to form the bottom film on the surface of the wafer W. Thereafter, the controller 100 controls the transfer arm A3 to return the wafer W having the bottom film formed thereon back into the shelf unit U10. The controller 100 then controls the elevation arm A7 to place this wafer W in the cell for the processing module 15.

Subsequently, the controller 100 controls the transfer arm A3 to transfer the wafer W placed in the shelf unit U10 into the liquid processing unit U1 and the heat treatment unit U2 within the processing module 15, and controls the liquid processing unit U1 and the heat treatment unit U2 to form the resist film on the bottom film of the wafer W. Thereafter, the controller 100 controls the transfer arm A3 to return the wafer W to the shelf unit U10, and controls the elevation arm A7 to place this wafer W in the cell for the processing module 16.

Afterwards, the controller 100 controls the transfer arm A3 to transfer the wafer W placed in the shelf unit U10 to the respective units within the processing module 16 and controls the liquid processing unit U1 and the heat treatment unit U2 to form the top film on the resist film of the wafer W. Then, the controller 100 controls the transfer arm A3 to return the wafer W to the shelf unit U10, and controls the elevation arm A7 to place this wafer W in the cell for the processing module 17.

Next, the controller 100 controls the direct transfer arm A6 to directly transfer the wafer W placed in the shelf unit U10 to the shelf unit U11, and controls the delivery arm A8 to send this wafer W to the exposure apparatus 3. Thereafter, the controller 100 controls the delivery arm A8 to receive the wafer W on which the exposure processing is already performed from the exposure apparatus 3 and return the received wafer W back into the shelf unit U11.

Thereafter, the controller 100 controls the transfer arm A3 to transfer the wafer W placed in the shelf unit U11 into the respective units within the processing module 17, and controls the liquid processing unit U1 and the heat treatment unit U2 to perform the developing processing on the resist film of the wafer W. Then, the controller 100 controls the transfer arm A3 to return the wafer W to the shelf unit U10, and controls the elevation arm A7 and the delivery arm A1 to return this wafer W back into the carrier 11. Then, the coating and developing processing is ended.

A specific configuration of the substrate processing apparatus is not limited to the above-described configuration of the coating and developing apparatus 2. The substrate processing apparatus may be implemented by any of various types of apparatuses as long as the apparatus has the liquid processing unit U1 for the developing processing (the liquid processing unit U1 of the processing module 17) and the controller 100 capable of controlling this liquid processing unit U1.

[Hydrophobizing Unit]

Figure 4:
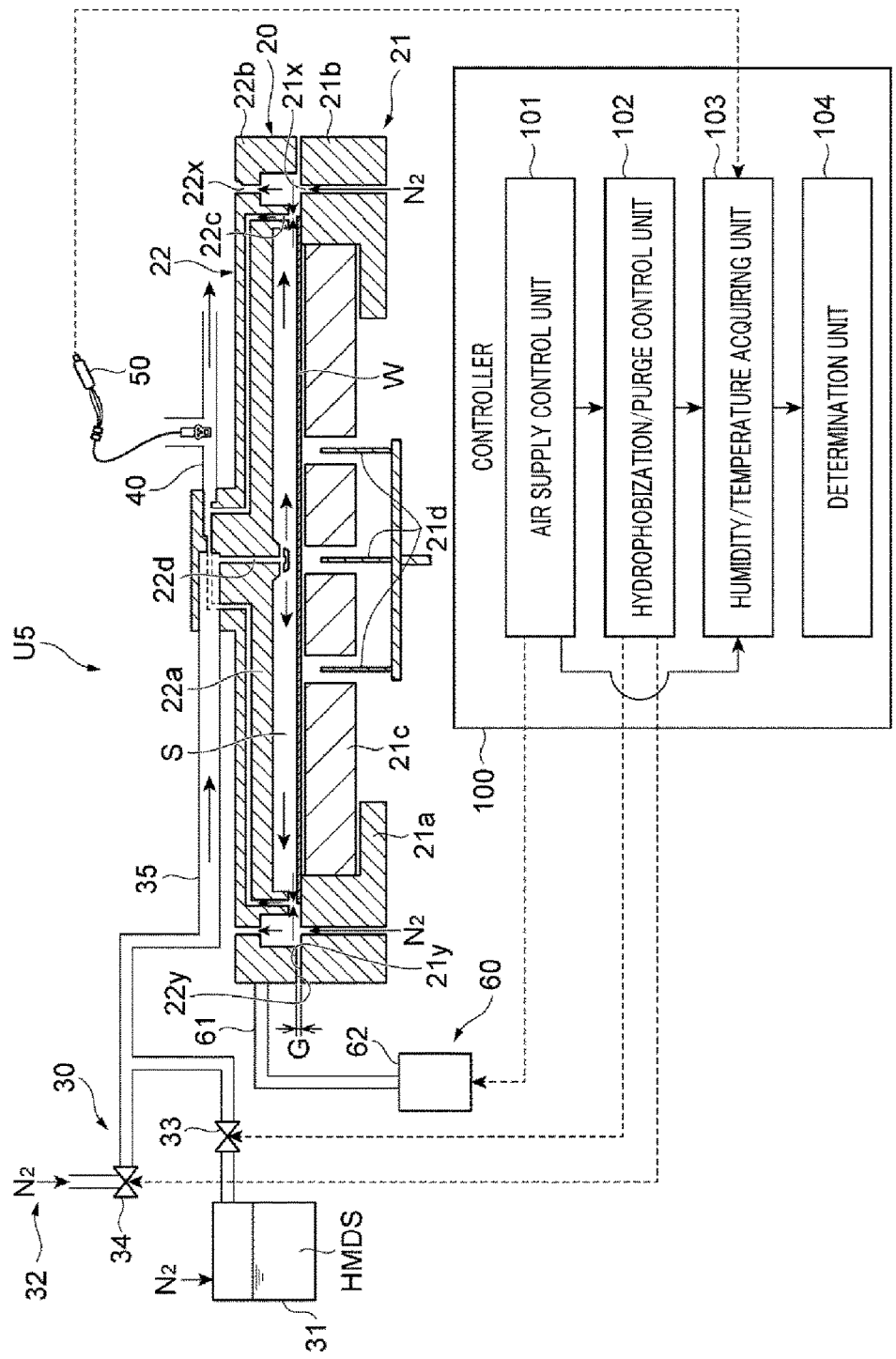
FIG. 4 is a diagram illustrating a schematic configuration of a hydrophobizing unit.

Now, the hydrophobizing unit U5 of the processing module 14 will be described in detail. The hydrophobizing unit U5 is a processing unit configured to perform a hydrophobic processing on the surface of the wafer W on which the bottom film is formed. As depicted in FIG. 4, the hydrophobizing unit U5 includes a hydrophobizing device 20, a gas supply unit 30 (a second supply unit, a purge gas supply unit), a gas exhaust line 40, a humidity sensor 50 (a humidity measuring unit), an opening/closing unit 60 (a first supply unit) and the controller 100.

(Hydrophobizing Device)

The hydrophobizing device 20 includes a processing vessel 21 and a cover body 22. The processing vessel 21 accommodates therein the wafer W as a processing target. The processing vessel 21 has a horizontally placed circular bottom plate 21a; a sidewall 21b extended vertically upwards from a peripheral portion of the bottom plate 21a; a heating plate 21c; and supporting pins 21d. The sidewall 21b has a through hole 21x which is formed through the sidewall 21b in a thickness direction thereof (i.e., in an extension direction of the sidewall 21b).

The heating plate 21c is configured to perform a heat treatment of the wafer W and is accommodated in the processing vessel 21 by being placed on the bottom plate 21a. The heating plate 21c incorporates therein, by way of non-limiting example, a heating wire (not shown), and a temperature of the heating plate 21c is increased as a power is fed to the heating wire. The temperature of the heating plate 21c may reach, by way of example, but not limitation, 90° C. to 200° C.

The supporting pins 21d are extended to penetrate the bottom plate 21a and the heating plate 21c in thickness directions thereof, and are configured to support the wafer W. A number of the supporting pins 21d may be, for example, three. As the supporting pins 21d are raised by an elevating mechanism (not shown) such as, but not limited to, an air cylinder, the supporting pins 21d move up the wafer W and place the wafer W at a required position on the heating plate 21c.

The cover body 22 is a cover member configured to close a top opening of the processing vessel 21. The cover body 22 includes a horizontally placed circular ceiling plate 22a and a sidewall 22b extended vertically downwards from a peripheral portion of the ceiling plate 22a. Even in a state that the cover body 22 is placed at a position where it closes the opening of the processing vessel 21 by the opening/closing unit 60 to be described later, a preset gap G is formed between a lower end 22y of a peripheral portion of the sidewall 22b of the cover body 22 and an upper end 21y of a peripheral portion of the sidewall 21b of the processing vessel 21. The preset gap G is set to be, by way of non-limiting example, 3 mm to 10 mm. In a state that the preset gap G is formed, a processing space S is formed between the processing vessel 21 and the cover body 22. The sidewall 22b is provided with a through hole 22x formed in a thickness direction thereof (i.e., an extension direction of the sidewall 22b); and an outer exhaust portion 22c. Further, a gas path 22d is formed at a central portion of the ceiling plate 22a.

The through hole 22x is formed to communicate with the through hole 21x of the processing vessel 21 in the state that the cover body 22 is placed at the position where it closes the opening of the processing vessel 21. When supplying a HMDS (hexamethyldisilazane) gas into the processing vessel 21 by the gas supply unit 30 to be described later, a nitrogen gas is supplied from a lower end of the through hole 21x as a purge gas. In this case, a surplus of the nitrogen gas in a purging processing is exhausted to the outside of the processing vessel 21 from an upper end of the through hole 22x after passing through the through hole 21x and the through hole 22x. Accordingly, a so-called air curtain is formed between the inside and the outside of the processing vessel 21, so that a leakage of the HMDS gas to the outside of the processing vessel 21 is suppressed.

The outer exhaust portion 22c exhausts a gas within the processing space S from an outer side (a peripheral side) than the wafer W placed on the heating plate 21c. The gas within the processing space S may include air as a first gas which is supplied when the processing vessel 21 is opened by the opening/closing unit 60 to be described later. Further, the gas within the processing space S may include air introduced into the processing space S from the gap G between the cover body 22 and the processing vessel 21. The gas within the processing space S may further include a processing gas (HMDS gas) as a second gas which is supplied by the gas supply unit 30 to be described later. The gas within the processing space S may include a nitrogen gas as a purge gas which is supplied by the gas supply unit 30 to be described later. The outer exhaust portion 22c is provided at an inner side than the through hole 22x of the sidewall 22b in a diametrical direction, and is composed of a multiple number of gas exhaust holes arranged in a ring shape along a circumferential direction at a regular distance therebetween. Each gas exhaust hole communicates with the gas exhaust line 40 to be described later.

The gas path 22*d* is formed at the central portion of the ceiling plate 22*a*. The HMDS gas as the processing gas and the nitrogen gas as the purge gas supplied from the gas supply unit 30 are flown into the processing space S through this gas path 22*d*. The gas path 22*d* is formed through the ceiling plate 22*a* in a thickness direction thereof and communicates with a gas supply line 35 of the gas supply unit 30.

(Gas Supply Unit)

The gas supply unit 30 serves as a second supply unit configured to supply into the processing vessel 21 a second gas having a relative humidity different from that of the air (first gas). The gas supply unit 30 is configured to supply the HMDS gas, as the second gas, which is the processing gas for hydrophobizing the surface of the wafer W. The relative humidity of the HMDS gas is very low as compared to the air and is, for example, 2.5%. Under the control of the controller 100 (details of which will be described later), the gas supply unit 30 supplies the HMDS gas as the processing gas immediately after the opening operation of the processing vessel 21 is completed by the opening/closing unit 60.

Further, the gas supply unit 30 also functions as a purge gas supply unit configured to supply the nitrogen gas as the purge gas to purge the HMDS gas within the processing vessel 21. A relative humidity of the nitrogen gas is 0% or is infinitely close to 0% and is extremely low as compared to the aforementioned air and HMDS gas. Under the control of the controller 100 (details of which will be described later), the gas supply unit 30 supplies the nitrogen gas as the purge gas after the HMDS gas as the processing gas is supplied.

The gas supply unit 30 includes a HMDS supply source 31, a nitrogen gas supply source 32, a HMDS supply valve 33, a N$_2$ purge valve 34 and the gas supply line 35. The HMDS supply source 31 is a source of the HMDS gas as the processing gas. For example, a liquid of the HMDS is stored in the HMDS supply source 31. By performing nitrogen bubbling on this liquid, the HMDS liquid is vaporized into the HMDS gas. Since the nitrogen bubbling is performed, the processing gas supplied from the HMDS supply source 31 contains a small amount of nitrogen gas as well as the HMDS gas. In the present exemplary embodiment, however, the processing gas supplied from the HMDS supply source 31 will be simply referred to as the HMDS gas. The nitrogen gas supply source 32 is a source of the nitrogen gas as the purge gas. The gas supply line 35 is configured to connect the HMDS supply source 31 and the gas path 22*d* and, also, connect the nitrogen gas supply source 32 and the gas path 22*d*.

The HMDS supply valve 33 is provided on the gas supply line 35 which connects the HMDS supply source 31 and the gas path 22*d*. The N$_2$ purge valve 34 is provided on the gas supply line 35 which connects the nitrogen gas supply source 32 and the gas path 22*d*. Each of the HMDS supply valve 33 and the N$_2$ purge valve 34 is configured to open/close a flow path within the gas supply line 35. As the HMDS supply valve 33 is opened, the processing gas (HMDS gas) flows from the HMDS supply source 31 into the gas path 22*d* through the gas supply line 35. As the N$_2$ purge valve 34 is opened, the purge gas (nitrogen gas) flows from the nitrogen gas supply source 32 into the gas path 22*d* through the gas supply line 35. The opening and closing of the HMDS supply valve 33 and the N$_2$ purge valve 34 are controlled by the controller 100 (details of this will be described later).

(Gas Exhaust Line)

The gas exhaust line 40 is a pipeline through which the gas within the processing vessel 21 is exhausted to the outside. The gas exhaust line 40 communicates with the individual exhaust holes of the outer exhaust portion 22*c*. The air as the first gas, the processing gas (HMDS gas) as the second gas and the nitrogen gas as the purge gas can flow in the gas exhaust line 40 through the outer exhaust portion 22*c*.

(Humidity Sensor)

The humidity sensor 50 is a humidity measuring unit configured to measure a relative humidity within the hydrophobizing unit U5 included in the coating and developing apparatus 2. To be more specific, the humidity sensor 50 is provided at the gas exhaust line 40 and measures a relative humidity of a gas flowing in the gas exhaust line 40. The humidity sensor 50 may be implemented by, for example, an electric humidity sensor. By way of non-limiting example, a capacitive humidity sensor or a resistive humidity sensor may be used. The capacitive humidity sensor has a configuration in which a sensor unit includes a capacitor and a polymer (a humidity sensing film) made of dielectric material is provided between an upper electrode and a lower electrode. In the capacitive humidity sensor, a variation in an electric capacity of the capacitor caused by moisture absorption and moisture desorption of the polymer is detected, and the relative humidity of the gas is measured based on the variation of the electric capacity. In the resistive humidity sensor, a variation in a resistance caused by moisture absorption and moisture desorption of the humidity sensing film is detected, and the relative humidity of the gas is measured based on the variation of the resistance. Furthermore, the humidity sensor 50 also has a function as a temperature measuring unit configured to measure a temperature within the hydrophobizing unit U5 included in the coating and developing apparatus 2. The humidity sensor 50 measures the humidity and the temperature under the control of the controller 100 and outputs the measured humidity and the measured temperature to the controller 100 (details of this will be described later).

(Opening/Closing Unit)

The opening/closing unit 60 serves as the first supply unit configured to supply the first gas having the relative humidity different from that of the HMDS gas (second gas) into the processing vessel 21. The opening/closing unit 60 supplies air as the first gas. The opening/closing unit 60 supplies the air into the processing vessel 21 by opening the processing vessel 21 under the control of the controller 100 (details of this will be described later). The opening/closing unit 60 includes a grip portion 61 which holds the cover body 22; and a driving unit 62 which has an actuator and is configured to drive the grip portion 61. The driving unit 62 moves the cover body 22 relatively upwards with respect to the processing vessel 21 by driving the grip portion 61 under the control of the controller 100. The opening/closing unit 60 opens the processing vessel 21 by moving the cover body 22 upwards from a state (closed state) in which the cover body 22 is placed at the position where it closes the opening of the processing vessel 21, so that the air is supplied into the processing vessel 21. The opening/closing unit 60 closes the opening of the processing vessel 21 with the cover body 22 by moving the cover body 22 downwards from a state (opened state) in which the processing vessel 21 is opened.

(Controller)

The controller 100 is configured to determine a state of the gas (gas state) within the processing vessel 21 based on the relative humidity obtained after the supply of the air by the opening/closing unit 60 and the supply of the HMDS gas by the gas supply unit 30 are performed. As an example of determining the gas state within the processing vessel 21, the controller 100 determines abnormality of a processing in the processing vessel 21.

The controller 100 is also configured to acquire the relative humidity measured by the humidity sensor 50, and determines, based on the acquired relative humidity, whether the processing in the processing vessel 21 is abnormal.

The controller 100 determines the abnormality of the processing in the processing vessel 21 by comparing the relative humidity measured by the humidity sensor 50 with reference data. Here, the reference data is the relative humidity obtained when the processing in the processing vessel 21 is performed normally.

The controller 100 converts a value of the relative humidity measured by the humidity sensor 50 in consideration of the temperature measured by the humidity sensor 50 and determines the abnormality of the processing in the processing vessel 21 based on the converted relative humidity.

The controller 100 is also configured to control the opening/closing unit 60 to supply the air into the processing vessel 21 by opening the processing vessel 21 and control the gas supply unit 30 to supply the HMDS gas after the supply of the air by the opening/closing unit 60 is ended. The controller 100 acquires a processing gas supply humidity, which is the relative humidity measured by the humidity sensor 50 after the supply of the HMDS gas by the gas supply unit 30, and determines the abnormality of the processing in the processing vessel 21 based on the processing gas supply humidity.

The controller 100 is also configured to control the gas supply unit 30 to supply the nitrogen gas as the purge gas after the supply of the HMDS gas by the gas supply unit 30 is ended. The controller 100 acquires a purge gas supply humidity, which is the relative humidity measured by the humidity sensor 50 after the supply of the nitrogen gas as the purge gas by the gas supply unit 30, and determines the abnormality of the processing in the processing vessel 21 based on the purge gas supply humidity.

As depicted in FIG. 4, the controller 100 has, as functional modules, an air supply control unit 101, a hydrophobization/purge control unit 102, a humidity/temperature acquiring unit 103 and a determination unit 104.

The air supply control unit 101 is configured to control the opening/closing unit 60 to supply the air into the processing vessel 21 by opening the processing vessel 21. To elaborate, the air supply control unit 101 controls the driving unit 62 of the opening/closing unit 60 such that the cover body 22 closing the opening of the processing vessel 21 is moved upwards (in a direction away from the processing vessel 21) (that is, such that the cover body 22 is opened). As the cover body 22 is opened, the processing vessel 21 is opened, and the air is supplied into the processing vessel 21. After the cover body 22 is opened, the air supply control unit 101 is configured to control the opening/closing unit 60 such that the opening of the processing vessel 21 is closed by the cover body 22 after the wafer W is carried into the processing vessel 21 to be placed on the heating plate 21c. To elaborate, the air supply control unit 101 controls the driving unit 62 of the opening/closing unit 60 such that the cover body 22 is moved downwards (in a direction approaching the processing vessel 21) from the state where the processing vessel 21 is opened (that is, such that the cover body 22 is closed). As the cover body 22 is closed, an inflow of the air from the opening of the processing vessel 21 is ended. As stated above, however, even in the state that the cover body 22 is closed, a small amount of air is supplied into the processing vessel 21 from the gap G between the cover body 22 and the processing vessel 21.

The hydrophobization/purge control unit 102 is configured to control the gas supply unit 30 to supply the HMDS gas after the supply of the air by the opening/closing unit 60 is ended. To be more specific, the hydrophobization/purge control unit 102 opens the HMDS supply valve 33 after the cover body 22 is closed by the air supply control unit 101. Accordingly, the HMDS gas is supplied into the processing vessel 21 from the HMDS supply source 31 through the gas supply line 35 and the gas path 22d. The hydrophobization/purge control unit 102 ends the supply of the HMDS gas by closing the HMDS supply valve 33 after a lapse of a preset time (e.g., 30 seconds).

The hydrophobization/purge control unit 102 is configured to control the gas supply unit 30 to supply the nitrogen gas as the purge gas after the supply of the HMDS gas by the gas supply unit 30 is finished. To elaborate, the hydrophobization/purge control unit 102 opens the $N_2$ purge valve 34 after the above-stated supply of the HMDS gas is finished. Accordingly, the nitrogen gas is supplied into the processing vessel 21 from the nitrogen gas supply source 32 through the gas supply line 35 and the gas path 22d. The hydrophobization/purge control unit 102 ends the supply of the nitrogen gas as the purge gas by closing the $N_2$ purge valve 34 after a lapse of a predetermined time (e.g., 10 seconds).

The humidity/temperature acquiring unit 103 is configured to acquire the relative humidity measured by the humidity sensor 50. The humidity/temperature acquiring unit 103 is also configured to acquire the temperature measured by the humidity sensor 50. The humidity/temperature acquiring unit 103 acquires the processing gas supply humidity, which is the relative humidity measured by the humidity sensor 50 after the supply of the HMDS gas by the gas supply unit 30, and the purge gas supply humidity, which is the relative humidity measured by the humidity sensor 50 after the supply of the nitrogen gas as the purge gas by the gas supply unit 30. To be more specific, the processing gas supply humidity refers to the relative humidity measured by the humidity sensor 50 after the supply of the HMDS gas and before the supply of the nitrogen gas as the purge gas. Further, the purge gas supply humidity refers to the relative humidity measured by the humidity sensor 50 after performing the supply of the nitrogen gas as the purge gas and before opening the cover body 22 (i.e., before carrying in a next wafer W to be processed subsequently). The humidity/temperature acquiring unit 103 previously sets in the humidity sensor 50 a measurement timing of the relative humidity by the humidity sensor 50 and a measurement timing of the temperature by the humidity sensor 50. By way of non-limiting example, the humidity/temperature acquiring unit 103 sets the measurement timing of the relative humidity and the measurement timing of the temperature such that the measurement of the relative humidity and the measurement of the temperature are performed continuously during the operation of the hydrophobizing unit U5.

The determination unit 104 is configured to determine the abnormality of the processing in the processing vessel 21 based on the relative humidity measured after the supply of the air by the opening/closing unit 60 and the supply of the HMDS gas by the gas supply unit 30 are performed. Here, the abnormality of the processing may include an increase of the air introduced into the processing vessel 21 which is caused by a failure to close the cover body 22 appropriately for any reason when supplying the HMDS gas, an increase of the air introduced into the processing vessel 21 from the gap G between the cover body 22 and the processing vessel 21 which is caused by a rise of an exhaust pressure, an insufficient supply of the nitrogen gas as the purge gas, and so forth. The abnormality of the processing may also include a change of a gas atmosphere which is caused by a bubbler tank defect, a pipeline deviation, or the like. The determination unit 104 determines such abnormality of the processing in the processing vessel 21 based on the relative humidity acquired from the humidity sensor 50 by the humidity/temperature acquiring unit 103.

The determination unit 104 determines the abnormality of the processing in the processing vessel 21 by comparing the relative humidity measured by the humidity sensor 50 with the reference data. Here, the reference data is the relative humidity obtained when the processing in the processing vessel 21 is performed normally. For example, this reference data is generated based on the relative humidity in a normal processing, which is actually measured by the humidity sensor 50 provided at the gas exhaust line 40.

Figure 5:
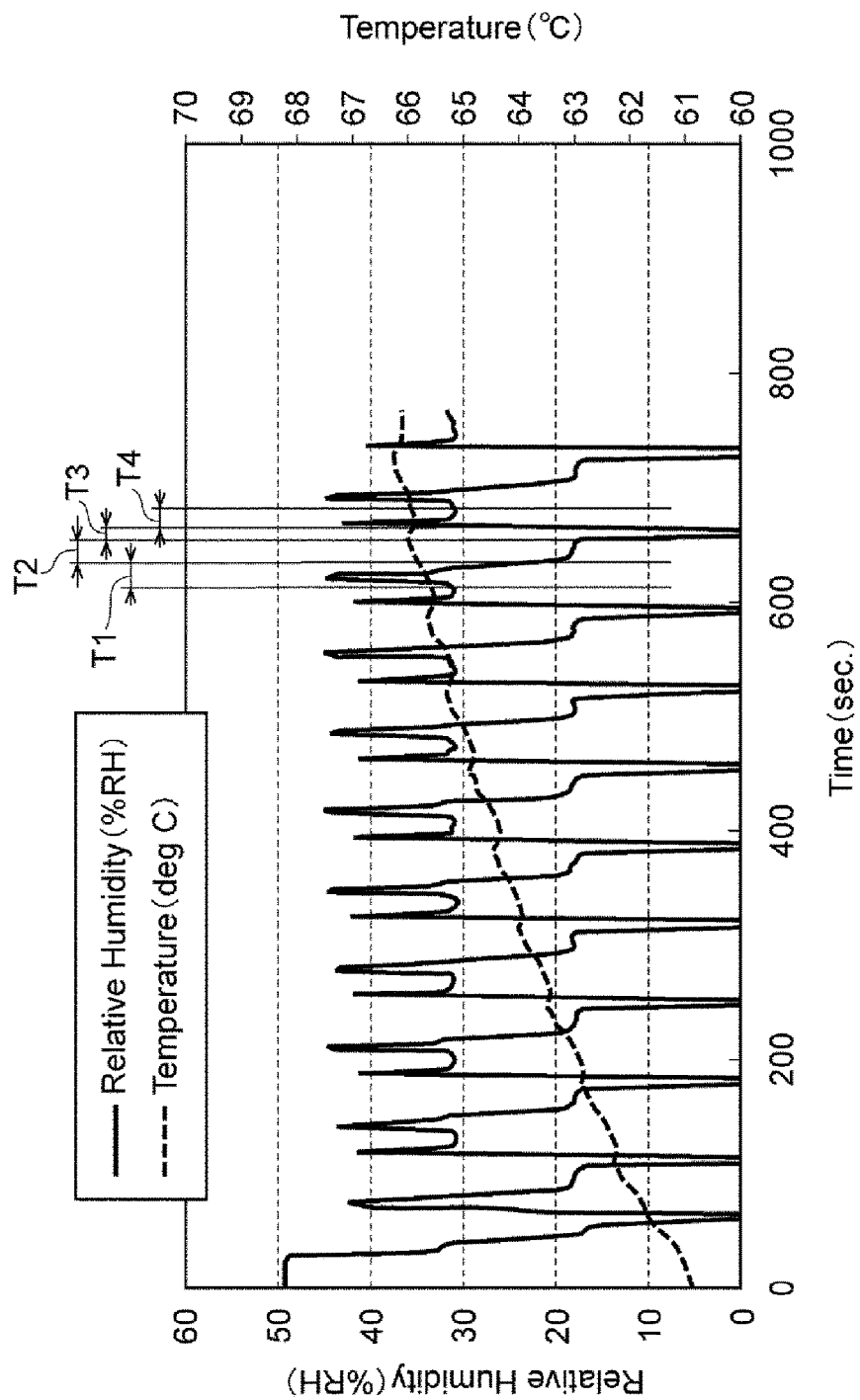
FIG. 5 is a graph showing measurement results (reference data) of a temperature and a relative humidity in a gas exhaust line in a normal processing.

FIG. 5 shows results (reference data) of the relative humidity and the temperature measured in the normal processing by the humidity sensor 50 provided at the gas exhaust line 40. In the example shown in FIG. 5, the hydrophobic processings on ten sheets of wafers W are performed consecutively. As shown in FIG. 5, the hydrophobic processing upon a single sheet of wafer W is composed of processings in a carry-in period T1, a HMDS supply period T2, a $N_2$ purge period T3 and a carry-out period T4, respectively.

In an earlier part of the carry-in period T1, since the cover body 22 is opened to carry the wafer W into the processing vessel 21 and the air is supplied into the processing vessel 21, the relative humidity within the processing vessel 21 increases, and the relative humidity measured by the humidity sensor 50 provided at the gas exhaust line 40 also increases. At this time, the relative humidity has a value corresponding to a relative humidity of an environment in which the coating and developing apparatus 2 is provided. Further, the coating and developing apparatus 2 is provided in the environment having, for example, the relative humidity of 45% and the temperature of 23° C. In a later part of the carry-in period T1, since the carrying of the wafer W into the processing vessel 21 is completed and a heat treatment of the wafer W by the heating plate 21c is performed while the cover body 22 is closed, the relative humidity declines.

In the HMDS supply period T2, since the HMDS gas having a humidity lower than that of the air is supplied from the HMDS supply source 31, the relative humidity within the processing vessel 21 decreases gently, and the relative humidity measured by the humidity sensor 50 provided at the gas exhaust line 40 also gently declines.

In the $N_2$ purge period T3, since the nitrogen gas having a humidity much lower than that of the air is supplied from the nitrogen gas supply source 32, the relative humidity within the processing vessel 21 decreases remarkably, and the relative humidity measured by the humidity sensor 50 provided at the gas exhaust line 40 declines conspicuously. The relative humidity measured by the humidity sensor 50 in the $N_2$ purge period T3 is, for example, 0%.

In the carry-out period T4, since the cover body 22 is opened to carry the wafer W out of the processing vessel 21, the relative humidity measured by the humidity sensor 50 increases. Thereafter, the cover body 22 is closed, and the taken-out wafer W is cooled by a cool arm (not shown). Since the cover body 22 is closed, however, the relative humidity measured by the humidity sensor 50 declines.

Further, in case that the hydrophobic processings are performed on the 10 sheets of the wafers W consecutively, the heat treatment is performed continuously within the processing vessel 21. Thus, as shown in FIG. 5, the temperature measured by the humidity sensor 50 increases as time elapses.

The determination unit 104 compares the relative humidity measured by the humidity sensor 50 with the reference data as shown in FIG. 5, and determines that the processing in the processing vessel 21 is in the abnormal state when the measurement result of the humidity sensor 50 is deviated from the reference data (details of which will be described later).

The determination unit 104 determines the abnormality of the processing in the processing vessel 21 based on the processing gas supply humidity. As depicted in FIG. 5, when the normal processing is performed, the relative humidity measured by the humidity sensor 50 gently declines in the HMDS supply period T2. Accordingly, the determination unit 104 determines that the processing in the processing vessel 21 is in the abnormal state if the processing gas supply humidity is not in the "gentle declination" state.

The determination unit 104 determines the abnormality of the processing in the processing vessel 21 based on the purge gas supply humidity. As shown in FIG. 5, when the normal processing is performed, the relative humidity measured by the humidity sensor 50 declines conspicuously in the $N_2$ purge period T3 and may become, for example, 0%. Accordingly, the determination unit 104 determines that the processing in the processing vessel 21 is in the abnormal state if the purge gas supply humidity is deviated from 0%, for example.

The determination unit 104 converts the value of the relative humidity measured by the humidity sensor 50 in consideration of the temperature measured by the humidity sensor 50, and then, determines the abnormality of the processing in the processing vessel 21 based on the converted relative humidity. Though the relative humidity varies depending on a temperature environment, a relative humidity (converted relative humidity) $U_2$ at a certain temperature can be drawn from the following Expression 1, for example. In the Expression 1, $U_2$ denotes the converted relative humidity; $U_1$, the relative humidity measured by the humidity sensor 50; $t_2$, the certain temperature; and $t_1$, the temperature measured by the humidity sensor 50.

[Expression 1]

$$U_2 = U_1 \cdot \frac{\exp\left(\frac{\beta \cdot t_1}{\lambda + t_1}\right)}{\exp\left(\frac{\beta \cdot t_2}{\lambda + t_2}\right)} \qquad (1)$$

Figure 6:
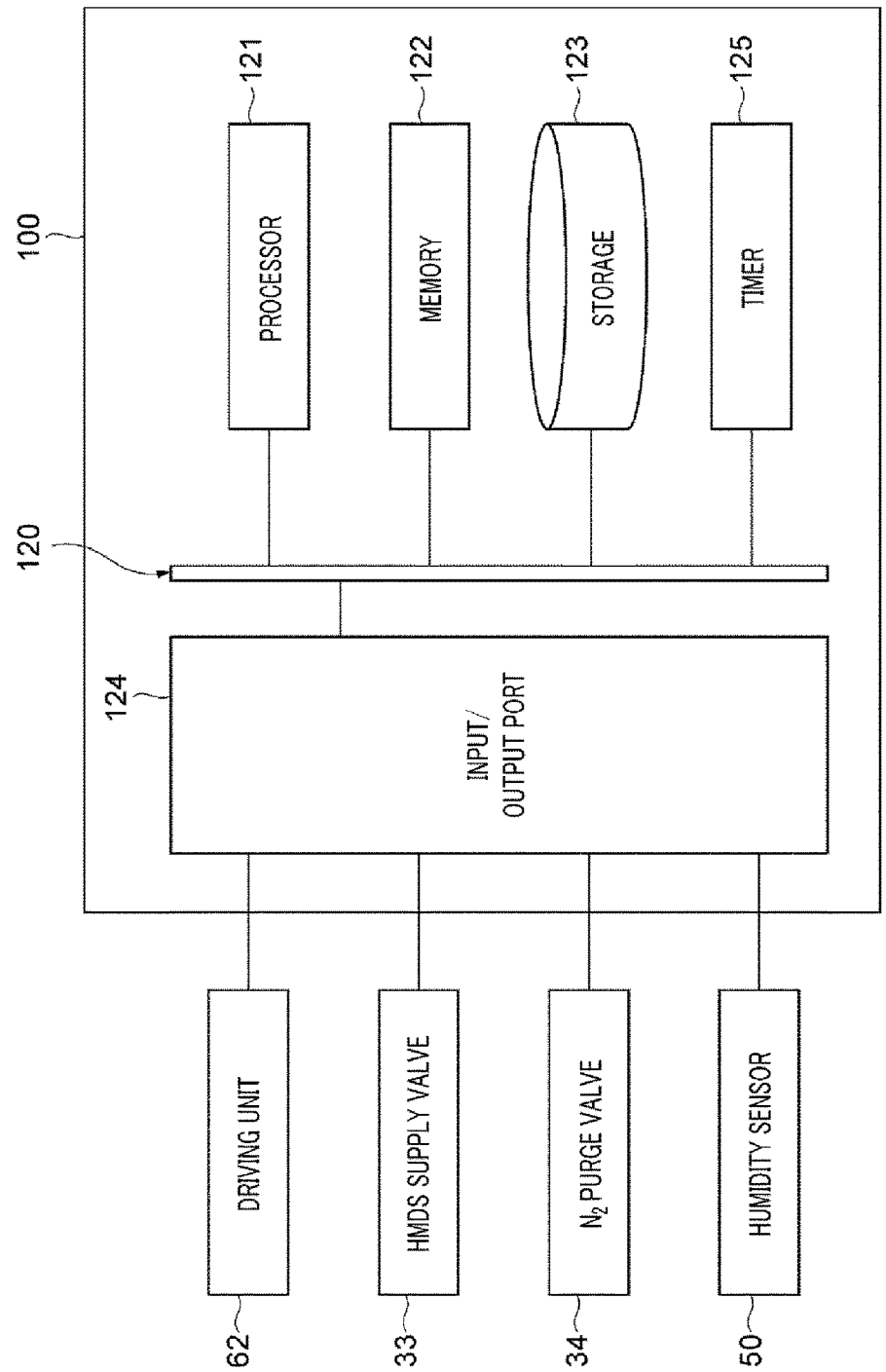
FIG. 6 is a hardware configuration view of a controller.

The controller 100 is composed of one or more control computers. By way of example, the controller 100 has a circuit 120 shown in FIG. 6. The circuit 120 includes one or more processors 121, a memory 122, a storage 123, an input/output port 124 and a timer 125.

The input/output port 124 is configured to perform an input and an output of an electric signal between the driving unit 62 of the opening/closing unit 60, the HMDS supply valve 33 of the gas supply unit 30, the $N_2$ purge valve 34 of the gas supply unit 30 and the humidity sensor 50. The timer 125 is configured to measure an elapsed time by, for example, counting a reference pulse of a preset cycle. The storage 123 has a computer readable recording medium such as, but not limited to, a hard disk. The recording medium stores programs for executing a substrate processing sequence to be described later. The recording medium may be implemented by a portable medium such as a non-volatile semiconductor memory, a magnetic disk or an optical disk. The memory 122 temporarily stores thereon the programs loaded from the recording medium of the storage 123 and an operation result by the processor 121. The processor 121 constitutes the aforementioned individual functional modules by executing the programs in cooperation with the memory 122.

Further, the hardware configuration of the controller 100 is not limited to constituting the individual functional modules by the program. For example, each functional module of the controller 100 may be implemented by a dedicated logical circuit or an ASIC (Application Specific Integrated Circuit) which is an integration of the logical circuits.

[Hydrophobic Processing Sequence]

Figure 7:
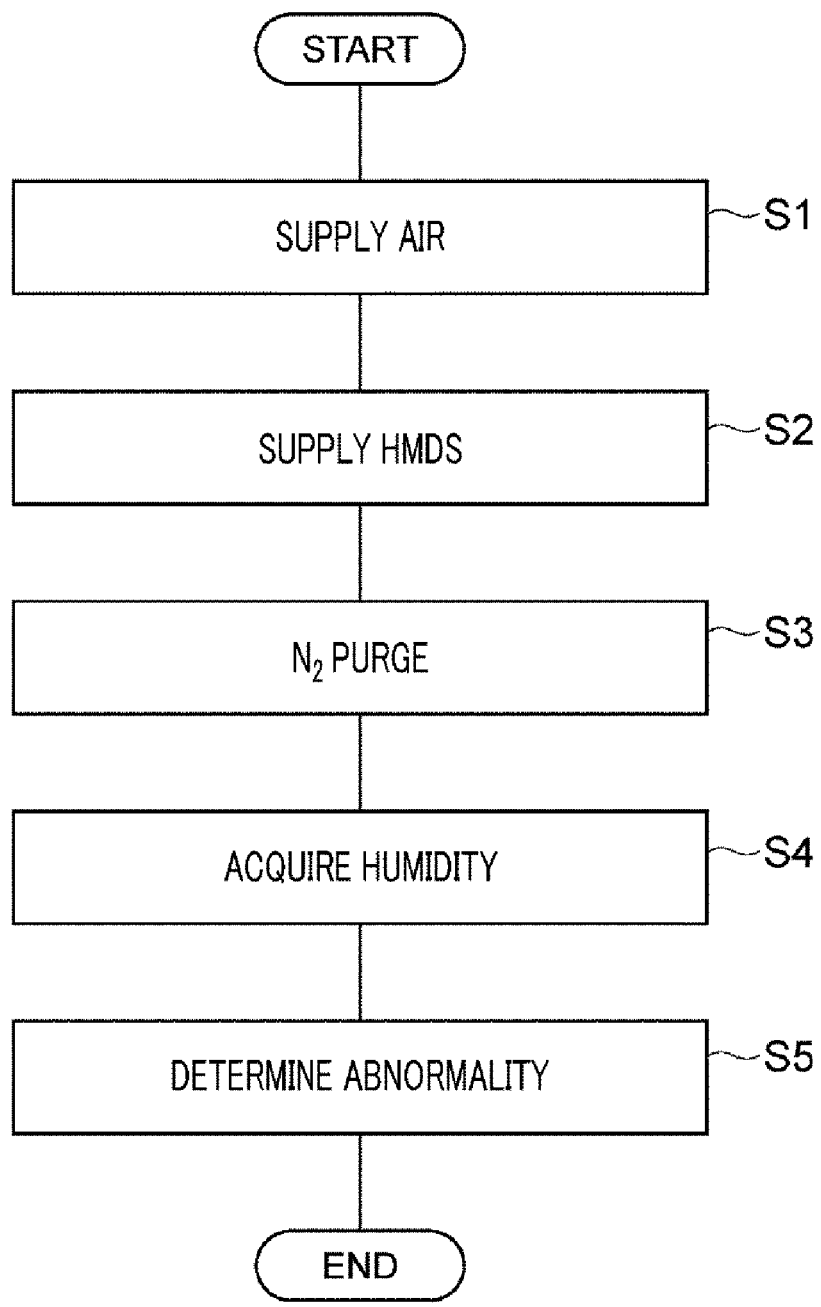
FIG. 7 is a flowchart showing a hydrophobic processing sequence.

Now, as an example of the substrate processing method, a hydrophobic processing sequence performed by the hydrophobizing unit U5 under the control of the controller 100 will be explained. As depicted in FIG. 7, the controller 100 performs processes S1, S2, S3, S4 and S5 in sequence. In the process S1, the air supply control unit 101 controls the opening/closing unit 60 to open the processing vessel 21 so that the air is supplied into the processing vessel 21. In the process S2, the hydrophobization/purge control unit 102 controls the gas supply unit 30 to supply the HMDS gas after the supply of the air by the opening/closing unit 60 is finished. In the process S3, the hydrophobization/purge control unit 102 controls the gas supply unit 30 to supply the nitrogen gas as the purge gas (that is, to perform the $N_2$ purge) after the supply of the HMDS gas by the gas supply unit 30 is completed. In the process S4, the humidity/temperature acquiring unit 103 acquires the relative humidity and the temperature measured by the humidity sensor 50. In the process S5, the determination unit 104 determines the abnormality of the processing in the processing vessel 21 based on the relative humidity obtained after the supply of the air by the opening/closing unit 60 and the supply of the HMDS gas by the gas supply unit 30 are performed. Hereinafter, details of the individual processes will be discussed.

(Air Supply Sequence)

Figure 8:
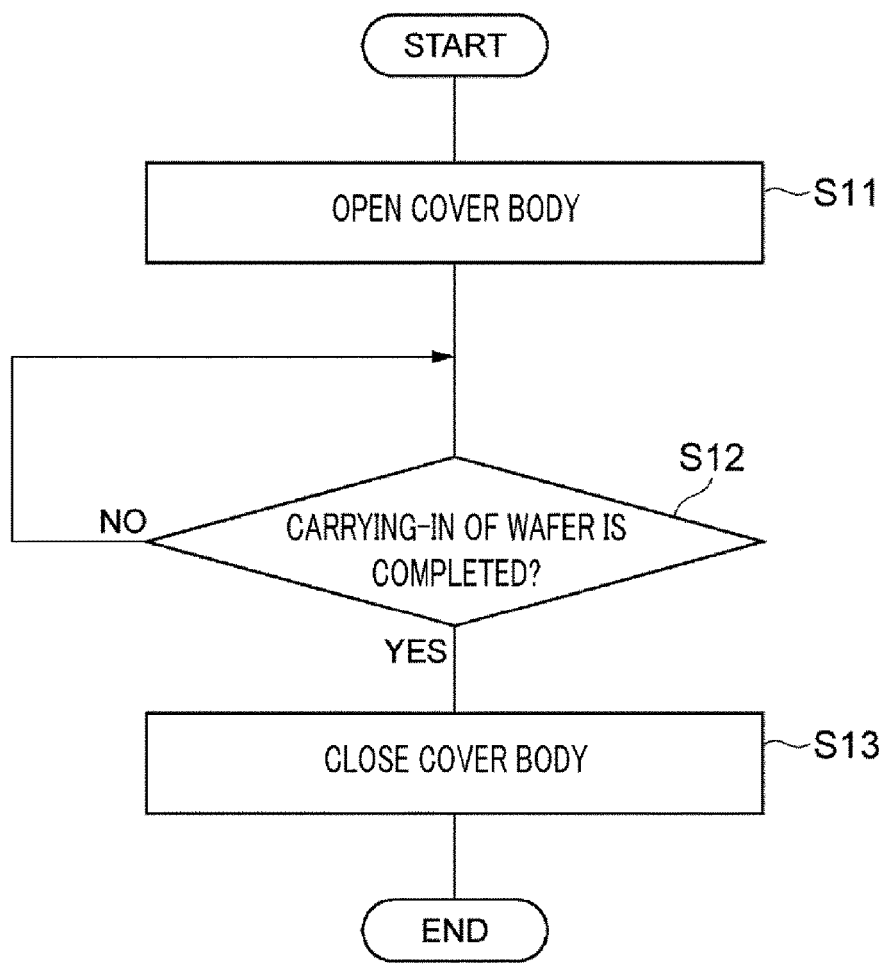
FIG. 8 is a flowchart showing an air supply sequence.

As shown in FIG. 8, the air supply control unit 101 performs processes S11 to S13 as the air supplying processing in the aforementioned process S1.

In the process S11, the air supply control unit 101 controls the driving unit 62 of the opening/closing unit 60 such that the cover body 22 closing the opening of the processing vessel 21 is moved upwards (in the direction away from the processing vessel 21) (that is, such that the cover body 22 is opened). As the cover body 22 is opened, the processing vessel 21 is opened, and the air is supplied into the processing vessel 21.

In the process S12, the air supply control unit 101 determines whether the wafer W as the target of the hydrophobic processing is carried in the processing vessel 21. The wafer W is carried into the processing vessel 21 by the transfer arm A3 controlled by the controller 100 to be placed on the heating plate 21c. If it is determined in the process S12 that the carrying-in of the wafer W is completed, the process S13 is performed, and if not, the process S12 is performed again after a lapse of a preset time.

In the process S13, the air supply control unit 101 controls the opening/closing unit 60 such that the opening of the processing vessel 21 is closed by the cover body 22. To elaborate, the air supply control unit 101 controls the driving unit 62 of the opening/closing unit 60 such that the cover body 22 is moved downwards (in the direction approaching the processing vessel 21) (that is, such that the cover body 22 is closed) from the state where the processing vessel 21 is opened.

(HMDS Supply Sequence)

Figure 9:
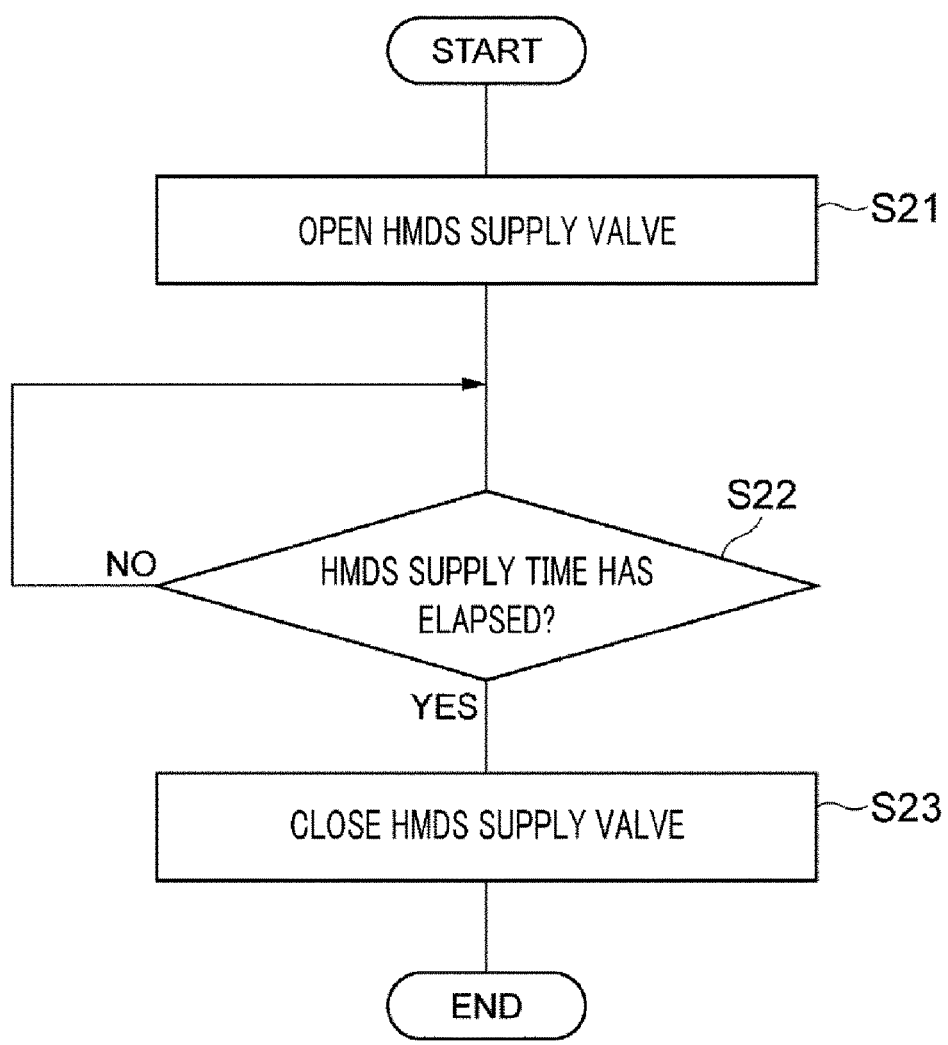
FIG. 9 is a flowchart showing a HMDS supply sequence.

As depicted in FIG. 9, the hydrophobization/purge control unit 102 performs processes S21 to S23 in sequence as the HMDS supplying processing in the aforementioned process S2.

In the process S21, the hydrophobization/purge control unit 102 opens the HMDS supply valve 33. Accordingly, the HMDS gas is supplied into the processing vessel 21 from the HMDS supply source 31 through the gas supply line 35 and the gas path 22d.

In the process S22, the hydrophobization/purge control unit 102 determines whether a preset HMDS supply time has elapsed. The HMDS supply time is set to be enough to perform the hydrophobization of the wafer W by the HMDS gas, for example, 30 seconds. If it is determined in the process S22 that the HMDS supply time has passed by, the process S23 is performed, and if not, the process S22 is performed again after a lapse of a preset time.

In the process S23, the hydrophobization/purge control unit 102 closes the HMDS supply valve 33. Accordingly, the supply of the HMDS gas into the processing vessel 21 is ended.

($N_2$ Purge Sequence)

Figure 10:
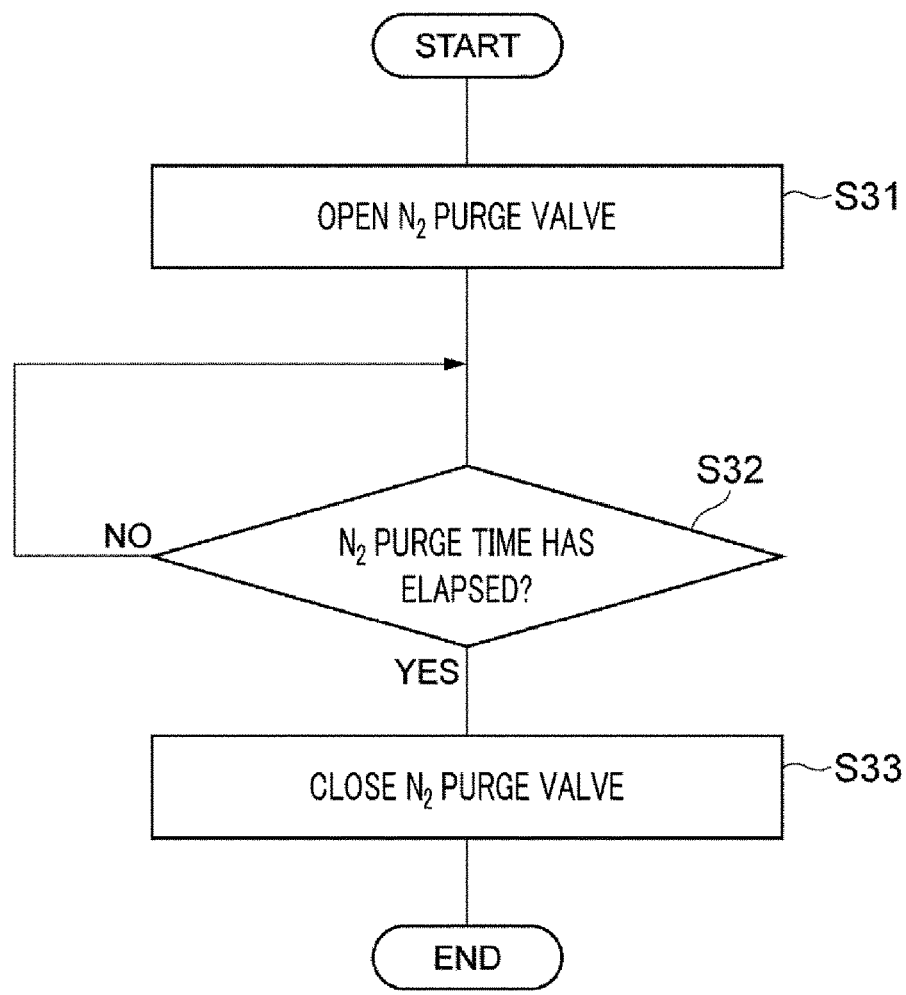
FIG. 10 is a flowchart showing a $N_2$ purge sequence.

As shown in FIG. 10, the hydrophobization/purge control unit 102 performs processes S31 to S33 in sequence as the $N_2$ purging processing in the aforementioned process S3.

In the process S31, the hydrophobization/purge control unit 102 opens the $N_2$ purge valve 34. Accordingly, the nitrogen gas is supplied into the processing vessel 21 from the nitrogen gas supply source 32 through the gas supply line 35 and the gas path 22d.

In the process S32, the hydrophobization/purge control unit 102 determines whether a preset $N_2$ purge time has elapsed. The $N_2$ purge time is set to be enough to perform the purge by the nitrogen gas, for example, 10 seconds. If it is determined in the process S32 that the $N_2$ purge time has passed by, the process S33 is performed, and if not, the process S32 is performed again after a lapse of a preset time.

In the process S33, the hydrophobization/purge control unit 102 closes the $N_2$ purge valve 34. Accordingly, the supply of the nitrogen gas into the processing vessel 21 is ended.

(Abnormality Determination Sequence)

Figure 11:
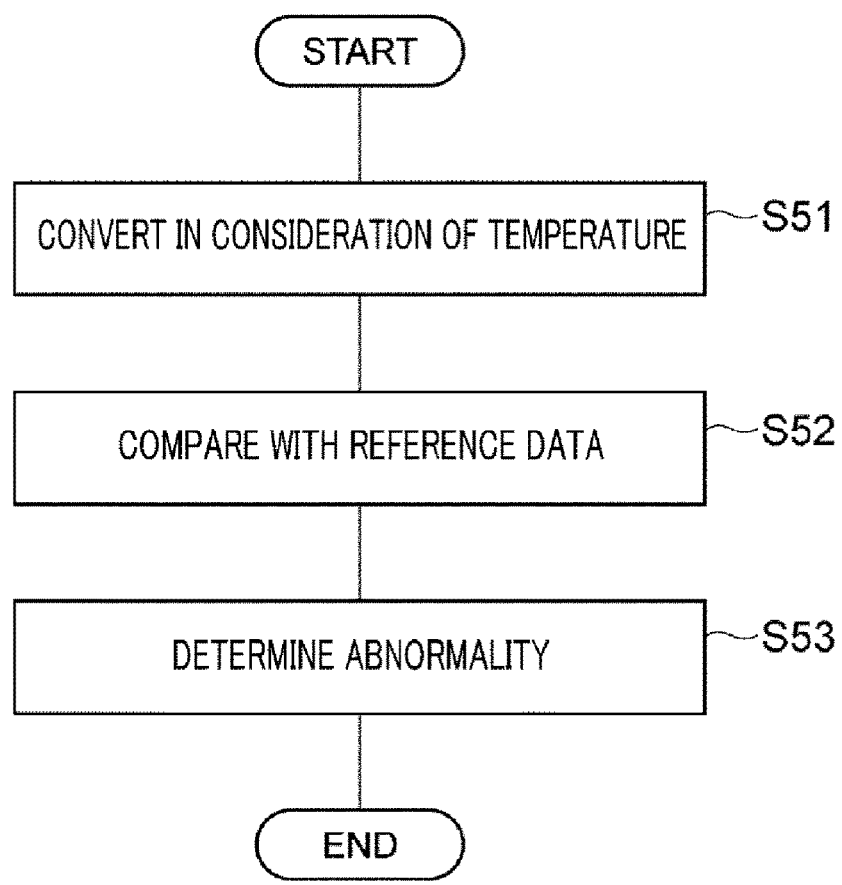
FIG. 11 is a flowchart showing an abnormality determination sequence.

As shown in FIG. 11, the determination unit 104 performs processes S51 to S53 in sequence as the abnormality determination processing in the aforementioned process S5.

In the process S51, the determination unit 104 converts the relative humidity measured by the humidity sensor 50 in consideration of the temperature measured by the humidity sensor 50, and determines whether the processing in the processing vessel 21 is abnormal based on the converted relative humidity.

In the process S52, the determination unit 104 compares the relative humidity measured by the humidity sensor 50 (specifically, the converted relative humidity reflecting the temperature) with the reference data. Here, the reference data is the relative humidity obtained when the processing in the processing vessel 21 is performed normally.

In the process S53, based on a result of comparing the relative humidity measured by the humidity sensor 50 with the reference data, if the measurement result of the humidity sensor 50 is found to be deviated from the reference data, the determination unit 104 determines that the processing in the processing vessel 21 is in the abnormal state. The determination unit 104 determines the abnormality of the processing in the processing vessel 21 based on, by way of example, the processing gas supply humidity. As depicted in FIG. 5, when the processing is performed normally, the relative humidity measured by the humidity sensor 50 in the HMDS supply period T2 gently decreases. Thus, the determination unit 104 determines that the processing in the processing vessel 21 is in the abnormal state if the processing gas supply humidity is not in the "gentle declination" state, for example. Further, the determination unit 104 determines the abnormality of the processing in the processing vessel 21 based on the purge gas supply humidity. As shown in FIG. 5, when the processing is performed normally, the relative humidity measured by the humidity sensor 50 in the N$_2$ purge period T3 declines conspicuously and may become, for example, 0%. Thus, the determination unit 104 determines that the processing in the processing vessel 21 is in the abnormal state if the purge gas supply humidity is deviated from 0%, for example.

[Effects of the Present Exemplary Embodiment]

The hydrophobizing unit U5 according to the present exemplary embodiment is equipped with the processing vessel 21 configured to accommodate therein the wafer W as the processing target; the opening/closing unit 60 (first supply unit) configured to supply the air (first gas) into the processing vessel 21; the gas supply unit 30 (second supply unit) configured to supply the HMDS gas (second gas) having the relative humidity different from that of the air into the processing vessel 21; and the controller 100 (control unit). The controller 100 is configured to determine the abnormality of the processing in the processing vessel 21 based on the relative humidity measured after the supply of the air by the opening/closing unit 60 and the supply of the HMDS gas by the gas supply unit 30 are performed.

In the hydrophobizing unit U5 according to the present exemplary embodiment, the air and the HMDS gas having different relative humidities are supplied into the processing vessel 21, and the abnormality of the processing is determined based on the relative humidity after the supply of these gases. In case that the gases having the different relative humidities are supplied, the relative humidity obtained after the supply of these gases is determined based on a supply ratio of these gases. For this reason, by considering the relative humidity after the supply of the gases, the increase or the decrease of the supply amount of one gas for any reason can be detected, for example. In this way, the abnormality of the processing in the processing vessel 21 can be appropriately detected. As stated above, in the hydrophobizing unit U5 according to the present exemplary embodiment, it is possible to detect the abnormal processing appropriately in the hydrophobic processing upon the wafer W as the processing target.

The processing gas (e.g., the HMDS gas) for hydrophobization is coated on the wafer W. Since, however, a thin film is formed, there is no way to investigate a coating error immediately after the coating is performed. Thus, it is typically difficult to detect the coating error until it becomes a defect after the developing processing. Though there is a method of investigating a coating state of the processing gas with an IR type concentration monitor, this concentration monitor is of a high price due to its complicated device configuration, and, also, it is difficult to detect the coating state of the processing gas with high accuracy. By acquiring the relative humidity obtained after the supply of the air and the supply of the HMDS gas, however, it is possible to accurately detect with a simple mechanism a state where the air is excessively supplied so that the processing gas is not properly coated, and so forth. That is, in the hydrophobizing unit U5 according to the exemplary embodiment, the abnormal processing in the hydrophobic processing on the surface of the wafer W can be appropriately detected during the hydrophobic processing with the simple mechanism. Therefore, a problem that a subsequent processing such as formation of the resist film after the hydrophobic processing is not properly performed can be suppressed with this simple mechanism.

The hydrophobizing unit U5 further includes the humidity sensor 50 configured to measure the relative humidity within the hydrophobizing unit U5. The controller 100 is configured to acquire the relative humidity measured by the humidity sensor 50 and determines the abnormality of the processing within the processing vessel 21 based on the acquired relative humidity. Accordingly, the relative humidity within the hydrophobizing unit U5 can be securely and easily obtained, so that the abnormal processing can be more appropriately detected.

The controller 100 determines the abnormality of the processing in the processing vessel 21 by comparing the relative humidity measured by the humidity sensor 50 with the reference data. The reference data is the relative humidity obtained when the processing in the processing vessel 21 is performed normally. By using this reference data, the abnormal processing can be detected easily with high accuracy.

The hydrophobizing unit U5 further includes the gas exhaust line 40 configured to exhaust the gas within the processing vessel 21 to the outside, and the humidity sensor 50 is provided at the gas exhaust line 40. As the relative humidity in the gas exhaust line 40 is measured, the relative humidity of the gas including both the air and the HMDS gas (that is, a gas in which the air and the HMDS gas are joined) supplied into the processing vessel 21 can be appropriately acquired. Accordingly, the abnormal processing can be more appropriately detected.

The humidity sensor 50 is configured to measure the temperature within the hydrophobizing unit U5. The controller 100 is configured to convert the value of the relative humidity measured by the humidity sensor 50 in consideration of the temperature measured by the humidity sensor 50 and configured to determine the abnormality of the processing in the processing vessel 21 based on the converted relative humidity. Since the relative humidity varies depending on the temperature environment, by converting the value of the relative humidity in consideration of the temperature, the abnormal processing can be more appropriately detected.

The humidity sensor 50 is implemented by the capacitive humidity sensor. Accordingly, the relative humidity can be more appropriately measured.

The controller 100 is also configured to control the opening/closing unit 60 to open the processing vessel 21 to supply the air into the processing vessel and control the gas supply unit 30 to supply the HMDS gas after the supply of the air by the opening/closing unit 60 is finished. Accordingly, the supply of the air and the supply of the HMDS gas can be appropriately performed in the hydrophobic processing. As a result, the relative humidity can be obtained appropriately, so that the abnormal processing can be appropriately detected.

The controller 100 acquires the processing gas supply humidity which is the relative humidity measured by the humidity sensor 50 after the supply of the HMDS gas by the gas supply unit 30, and then, determines the abnormality of the processing in the processing vessel 21 based on the processing gas supply humidity. Since the HMDS gas has the relative humidity lower than the air, when the processing is performed normally, the processing gas supply humidity becomes lower than the humidity before the supply of the HMDS gas. Thus, if the processing gas supply humidity is not lower than the humidity before the supply of the processing gas, for example, it may be determined that the processing is abnormal.

The gas supply unit 30 is configured to supply the nitrogen gas as the purge gas having the relative humidity lower than those of the air and the HMDS gas in order to purge the HMDS gas after the HMDS gas is supplied. Further, the controller 100 is also configured to control the gas supply unit 30 to supply the nitrogen gas as the purge gas after the supply of the HMDS gas is finished. Accordingly, the HMDS gas after the hydrophobic processing can be appropriately purged, so that a next hydrophobic processing can be appropriately performed.

The controller 100 acquires the purge gas supply humidity, which is a relative humidity measured by the humidity sensor 50 after the supply of the nitrogen gas as the purge gas by the gas supply unit 30, and then, determines the abnormality of the processing in the processing vessel 21 based on the purge gas supply humidity. The purge gas has the relative humidity very much lower than those of the air and the HMDS gas. Thus, when the processing is performed normally, the purge gas supply humidity becomes remarkably lower (e.g., 0%) than the humidity before the supply of the purge gas. Therefore, if the purge gas supply humidity is not 0%, for example, it may be determined that the processing is abnormal.

Figure 12A:
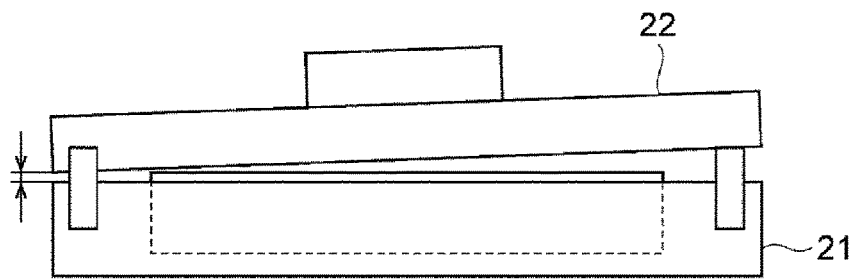
FIG. 12A and FIG. 12B are diagrams for describing a relative humidity when one side of a cover body is raised.
Figure 12B:
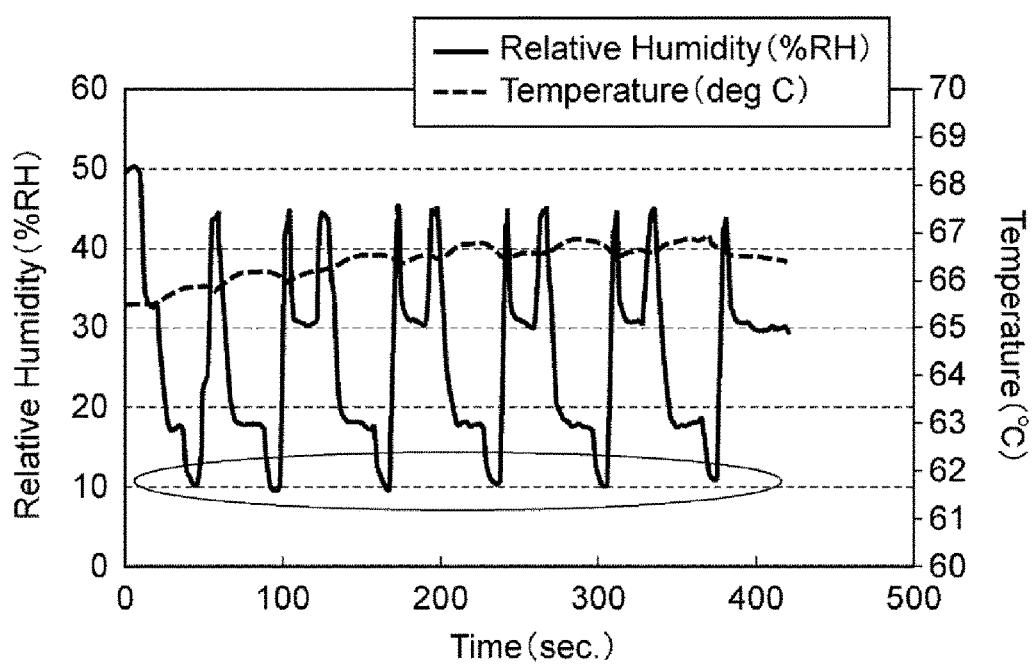

By way of example, as shown in FIG. 12A, assume that the cover body 22 is not properly closed and one side thereof is raised for some reason in the state that the cover body 22 is placed at the position where it closes the opening of the processing vessel 21. In this case, the air introduced into the processing vessel 21 is increased. FIG. 12B shows the relative humidity measured when the one side of the cover body 22 is raised. As depicted in FIG. 12B, if the one side of the cover body 22 is raised, amount of the air introduced into the processing vessel 21 is increased, so that the purge gas supply humidity is found to be about 10%, which shows a big difference from 0%. Accordingly, in case that the cover body 22 is in the state where the one side thereof is raised, the controller 100 can detect the abnormality of the processing in the processing vessel 21 based on the purge gas supply humidity.

Figure 13A:
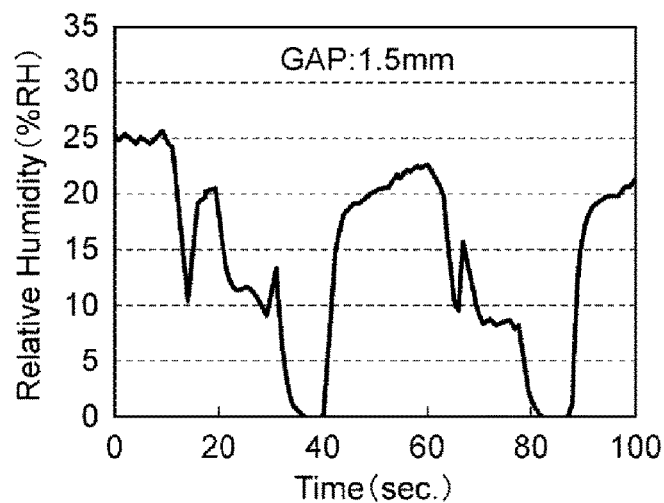
FIG. 13A to FIG. 13C are diagrams for describing a relative humidity when one side of the cover body is raised.
Figure 13B:
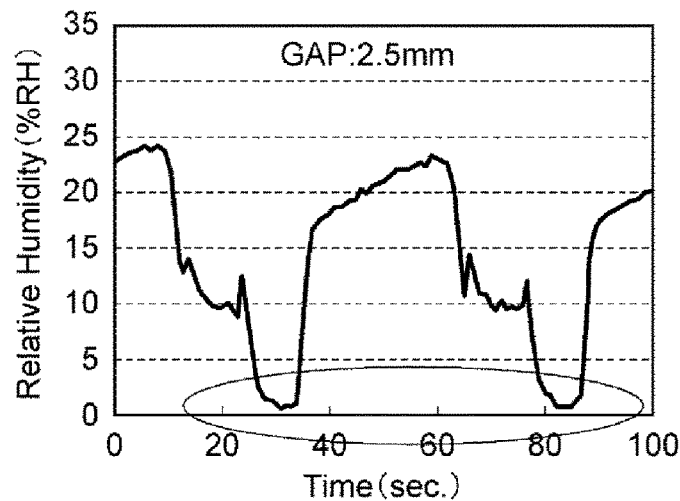
Figure 13C:
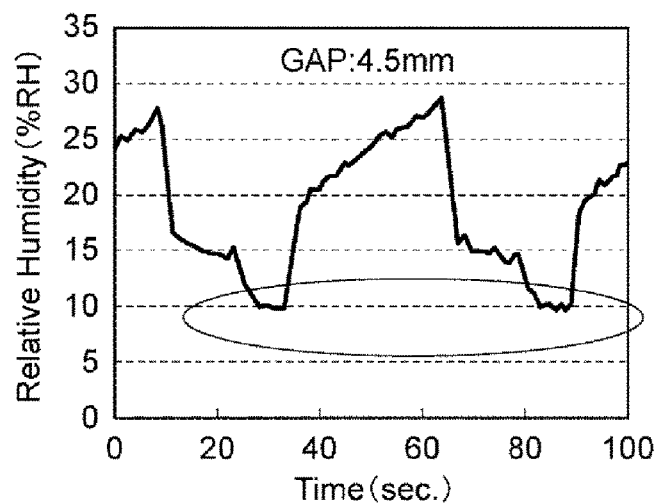

Furthermore, the present inventors conducted an experiment to investigate a height of the raised one side of the cover body 22 at which the abnormality of the processing in the processing vessel 21 is detected from the purge gas supply humidity. FIG. 13A to FIG. 13C show results of measuring the purge gas supply humidity while setting the temperature of the heating plate 21c to 180° C. and converting the value of the relative humidity in terms of 25° C. environment. When the height of the raised one side is 1.5 mm as shown in FIG. 13A, it is difficult to detect the abnormality only from the purge gas supply humidity. However, when the height of the raised one side is 2.5 mm as shown in FIG. 13B and 4.5 mm as shown in FIG. 13C, the purge gas supply humidity becomes higher than 0%, and the abnormality of the processing can be detected from the purge gas supply humidity.

Figure 14A:
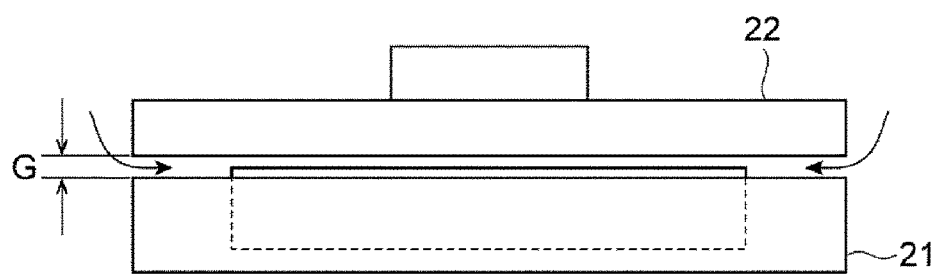
FIG. 14A and FIG. 14B are diagrams for describing a relative humidity when an exhaust pressure is high.
Figure 14B:
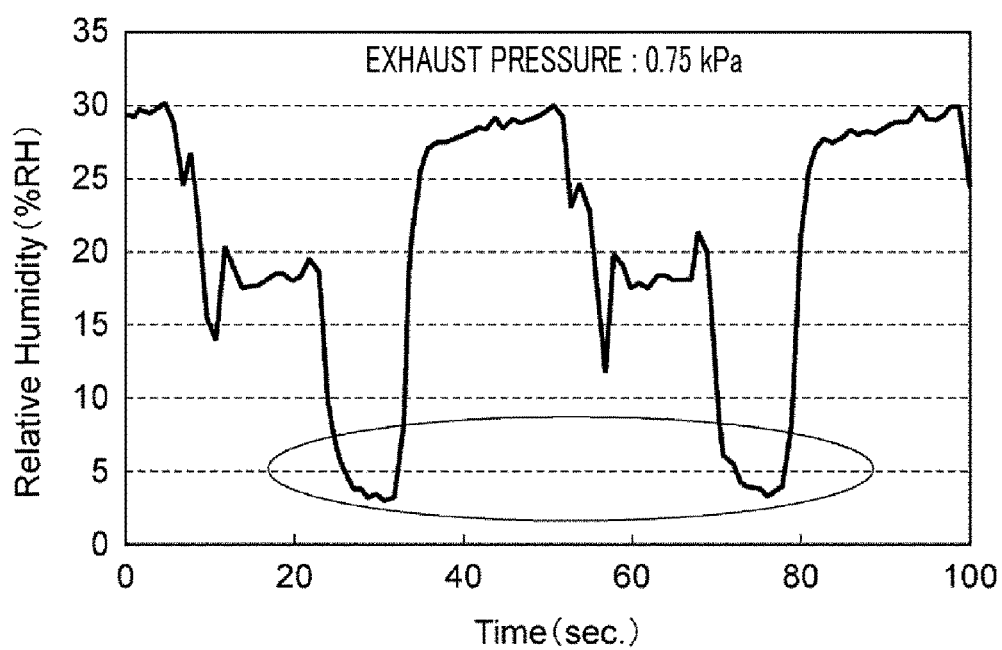

Besides, as depicted in FIG. 14A, assume that the exhaust pressure is increased for some reason and the inflow of the air from the gap G is increased even when the cover body 22 is properly closed with respect to the processing vessel 21. FIG. 14B shows the relative humidity measured when the exhaust pressure, which is typically 0.45 kPa, becomes, e.g., 0.75 kPa. As shown in FIG. 14B, when the exhaust pressure is increased, the purge gas supply humidity is found to be about 4%, which shows a big difference from 0%. As can be seen from this, the controller 100 is able to detect the abnormality of the processing in the processing vessel 21 from the purge gas supply humidity in case that the exhaust pressure is increased.

So far, the exemplary embodiment has been described. However, it should be noted that the exemplary embodiment is not limiting. For example, though the humidity sensor 50 is described to be provided at the gas exhaust line 40, the humidity sensor may be provided within the processing vessel as long as it is capable of measuring the relative humidity of the gas including both the first gas (e.g., air) and the second gas (e.g., HMDS gas).

Further, though the humidity sensor 50 is described to have the temperature measuring function, the humidity sensor may not has this function but may only be configured to measure the relative humidity. In this case, a temperature sensor may be provided separately from the humidity sensor.

Further, though the gas supply unit 30 is described to supply both the HMDS gas as the processing gas and the nitrogen gas as the purge gas, a device configured to supply these gases may be separately provided.

Furthermore, though the exemplary embodiment has been described to be applied to the hydrophobizing unit U5 configured to perform the hydrophobic processing, the exemplary embodiment is not limited thereto and may be applied to various apparatuses such as, but not still limited to, a low-oxygen-concentration oven or a UV irradiation unit configured to supply multiple gases having different relative humidities into a processing vessel in which a substrate is accommodated.

Besides, as an example of determining the gas state within the processing vessel 21 by the controller 100 based on the relative humidity, the exemplary embodiment has been described for the case of determining the abnormality of the processing in the processing vessel 21. However, the exemplary embodiment is not limited thereto. That is, the control unit may determine a gas concentration within the processing vessel based on the relative humidity obtained after the supply of the first gas by the first supply unit and the supply of the second gas by the second supply unit are performed. In such a case, the control unit may determine the gas concentration (concentrations of each of the first gas and the second gas) in the processing vessel from the measured relative humidity based on a humidity/concentration table in which the relative humidity and a combination of the concentrations of the first gas and the second gas are matched. In addition, the control unit may determine the concentration of one of the gases in the processing vessel from the measured relative humidity based on a humidity/concentration table in which the relative humidity and a concentration of the one of the first gas and the second gas are matched.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a processing vessel configured to accommodate therein a substrate as a processing target;
a first supply unit configured to supply a first gas into the processing vessel;
a second supply unit configured to supply a second gas, having a relative humidity different from that of the first gas, into the processing vessel; and
a control unit,
wherein the control unit is configured to determine a state of a gas within the processing vessel based on a relative humidity obtained after a supply of the first gas by the first supply unit and a supply of the second gas by the second supply unit are performed,
wherein the state of the gas includes a supply ratio of the first and second gases.

2. The substrate processing apparatus of claim 1, further comprising:
a humidity measuring unit configured to measure the relative humidity within the substrate processing apparatus,
wherein the control unit is configured to acquire the relative humidity measured by the humidity measuring unit, and determines abnormality of a processing in the processing vessel based on the acquired relative humidity.

3. The substrate processing apparatus of claim 1, wherein the control unit determines a concentration of the gas within the processing vessel based on the relative humidity obtained after the supply of the first gas by the first supply unit and the supply of the second gas by the second supply unit are performed.

4. The substrate processing apparatus of claim 2, wherein the control unit determines the abnormality of the processing in the processing vessel by comparing the relative humidity measured by the humidity measuring unit with a reference data which is a relative humidity obtained when the processing in the processing vessel is performed normally.

5. The substrate processing apparatus of claim 2, further comprising:
a gas exhaust line configured to exhaust the gas within the processing vessel,
wherein the humidity measuring unit is provided at the gas exhaust line.

6. The substrate processing apparatus of claim 2, further comprising:
a temperature measuring unit configured to measure a temperature within the processing vessel,
wherein the control unit converts a value of the relative humidity measured by the humidity measuring unit in consideration of the temperature measured by the temperature measuring unit, and determines the abnormality of the processing in the processing vessel based on the converted relative humidity.

7. The substrate processing apparatus of claim 2, wherein the humidity measuring unit is a capacitive humidity sensor.

8. The substrate processing apparatus of claim 2, wherein the first supply unit supplies air as the first gas, and
the second supply unit supplies as the second gas a processing gas for hydrophobization of a surface of the substrate.

9. The substrate processing apparatus of claim 8, wherein the control unit is configured to control the first supply unit to supply the air into the processing vessel by opening the processing vessel, and control the second supply unit to supply the processing gas after the supply of the air by the first supply unit is ended.

10. The substrate processing apparatus of claim 8, further comprising:
a purge gas supply unit configured to supply a purge gas having a relative humidity lower than those of the air and the processing gas in order to purge the processing gas after the supply of the processing gas by the second supply unit,
wherein the control unit is configured to control the purge gas supply unit to supply the purge gas after the supply of the processing gas by the second supply unit is ended.

11. The substrate processing apparatus of claim 9, wherein the control unit acquires a processing gas supply humidity which is the relative humidity measured by the humidity measuring unit after the supply of the processing gas by the second supply unit, and determines the abnormality of the processing in the processing vessel based on the processing gas supply humidity.

12. The substrate processing apparatus of claim 10, wherein the control unit acquires a purge gas supply humidity which is the relative humidity measured by the humidity measuring unit after the supply of the purge gas by the purge gas supply unit, and determines the abnormality of the processing in the processing vessel based on the purge gas supply humidity.

13. A substrate processing method performed by a substrate processing apparatus, comprising:
supplying a first gas into a processing vessel configured to accommodate therein a substrate as a processing target;
supplying a second gas, having a relative humidity different from that of the first gas, into the processing vessel; and
determining a state of a gas in the processing vessel based on a relative humidity obtained after the supplying of the first gas and the supplying of the second gas are performed,
wherein the state of the gas includes a supply ratio of the first and second gases.

* * * * *